United States Patent
Chartier et al.

(10) Patent No.: US 11,052,584 B2
(45) Date of Patent: Jul. 6, 2021

(54) INJECTION MOLDED PLASTIC OBJECT WITH AN EMBEDDED ELECTRONIC CIRCUIT PRINTED ON A PAPER BASE AND METHOD OF ITS PRODUCTION

(71) Applicant: ARJO WIGGINS FINE PAPERS LIMITED, Manchester (GB)

(72) Inventors: Christophe Chartier, Apprieu (FR); Gaël Depres, Chirens (FR); Jean-Marie Vau, Paris (FR)

(73) Assignee: AW BRANDING LIMITED, Aberdeen (GB)

( * ) Notice: Subject to any disclaimer, the term of this patent is extended or adjusted under 35 U.S.C. 154(b) by 654 days.

(21) Appl. No.: 15/776,192

(22) PCT Filed: Nov. 15, 2016

(86) PCT No.: PCT/EP2016/077784
§ 371 (c)(1),
(2) Date: May 15, 2018

(87) PCT Pub. No.: WO2017/085085
PCT Pub. Date: May 26, 2017

(65) Prior Publication Data
US 2020/0254662 A1    Aug. 13, 2020

Related U.S. Application Data

(60) Provisional application No. 62/255,889, filed on Nov. 16, 2015.

(30) Foreign Application Priority Data

Dec. 31, 2015 (EP) ..................................... 15307198

(51) Int. Cl.
*H05K 1/00* (2006.01)
*H05K 3/00* (2006.01)
(Continued)

(52) U.S. Cl.
CPC .. *B29C 45/14639* (2013.01); *B29C 45/14811* (2013.01); *H01Q 1/38* (2013.01);
(Continued)

(58) Field of Classification Search
CPC . H05K 1/00; H05K 3/00; B29C 45/14; B29C 45/14639; B29C 45/14811;
(Continued)

(56) References Cited

U.S. PATENT DOCUMENTS 4,790,893 A * 12/1988 Watkins ................ B29C 43/222
156/232
6,032,357 A * 3/2000 Wojewnik ........... B60R 16/0207
156/219
(Continued)

FOREIGN PATENT DOCUMENTS

EP  1 873 693 A2  1/2008
EP  2 516 741 B1  8/2014
(Continued)

OTHER PUBLICATIONS

International Search Report and Written Opinion dated Jan. 20, 2017 issued in corresponding application No. PCT/EP2016/077784; in English (16 pages).
(Continued)

*Primary Examiner* — Xiaoliang Chen
(74) *Attorney, Agent, or Firm* — Westerman, Hattori, Daniels & Adrian, LLP

(57) ABSTRACT

The invention relates to a method to embed a label essentially consisting of a paper substrate carrying electronic inks and/or a printed electronic circuit and/or device (thereby achieving a paper-based electronic circuit) directly into a moulded plastic piece (also designated as plastic object), the embedding of the paper-based electronic circuit and the production of the plastic piece being performed in a single
(Continued)

operation. The invention thus also relates to a method to manufacture plastic objects embedding such label. The invention also concerns a plastic object encompassing a label essentially consisting of a paper substrate carrying electronic inks and/or a printed electronic circuit and/or device (thereby achieving a paper-based electronic circuit) embedded in the moulded plastic and in particular an object obtained by the method disclosed to prepare a moulded plastic piece.

21 Claims, 2 Drawing Sheets

(51) Int. Cl.
| | |
|---|---|
| B29C 45/14 | (2006.01) |
| B29C 51/00 | (2006.01) |
| B29C 51/02 | (2006.01) |
| B32B 21/08 | (2006.01) |
| H01Q 1/38 | (2006.01) |
| H05K 1/03 | (2006.01) |
| H05K 1/09 | (2006.01) |
| H05K 3/12 | (2006.01) |
| H05K 3/28 | (2006.01) |
| H05K 5/06 | (2006.01) |
| B29K 711/12 | (2006.01) |
| B29L 31/34 | (2006.01) |

(52) U.S. Cl.
CPC ........... *H05K 1/0386* (2013.01); *H05K 1/095* (2013.01); *H05K 3/12* (2013.01); *H05K 3/284* (2013.01); *H05K 3/285* (2013.01); *H05K 5/065* (2013.01); *B29C 2045/14852* (2013.01); *B29K 2711/123* (2013.01); *B29L 2031/3425* (2013.01); *H05K 2201/0129* (2013.01); *H05K 2201/0145* (2013.01); *H05K 2201/10098* (2013.01); *H05K 2203/1316* (2013.01); *H05K 2203/1327* (2013.01)

(58) Field of Classification Search
CPC ......... B29C 47/06; B29C 47/58; B29C 51/00; B29C 51/02; B32B 21/08
USPC ....... 361/748; 428/98, 212, 323, 411.1, 412, 428/480; 29/846; 156/219, 220, 232; 264/211, 211.13, 331.21
See application file for complete search history.

(56) References Cited

U.S. PATENT DOCUMENTS

| | | |
|---|---|---|
| 7,901,756 B2 | 3/2011 | Burr et al. |
| 9,416,495 B2 | 8/2016 | Depres et al. |
| 2003/0175488 A1* | 9/2003 | Asthana ................. B29C 51/02 428/212 |
| 2004/0227267 A1 | 11/2004 | Williams et al. |
| 2005/0001349 A1* | 1/2005 | Yosimura ................. C08K 5/20 264/211 |
| 2007/0257398 A1 | 11/2007 | Moncrieff |
| 2008/0213525 A1 | 9/2008 | Ritamaki et al. |
| 2009/0056994 A1 | 3/2009 | Kuhr et al. |
| 2009/0173163 A1* | 7/2009 | Workman ................. G01N 3/02 73/803 |
| 2009/0197064 A1 | 8/2009 | Benattar |
| 2010/0291329 A1 | 11/2010 | Di Duca |
| 2012/0015176 A1* | 1/2012 | Riebel ..................... B32B 27/06 428/323 |
| 2012/0024577 A1 | 2/2012 | Stroeks et al. |
| 2012/0132273 A1* | 5/2012 | Lee ................. H01L 31/022425 136/256 |
| 2012/0234585 A1 | 9/2012 | Schmidt et al. |
| 2012/0235847 A1 | 9/2012 | Viikari et al. |
| 2012/0308744 A1 | 12/2012 | Depres et al. |
| 2012/0314348 A1 | 12/2012 | Moncrieff |
| 2013/0341071 A1 | 12/2013 | Stebbins |
| 2015/0018659 A1 | 1/2015 | Ware et al. |
| 2015/0341088 A1 | 11/2015 | Jaakkola et al. |
| 2016/0251805 A1 | 9/2016 | Depres |
| 2016/0309595 A1 | 10/2016 | Heikkinen et al. |
| 2016/0313255 A1 | 10/2016 | Pardee et al. |

FOREIGN PATENT DOCUMENTS

| | | |
|---|---|---|
| FR | 2 954 361 A1 | 6/2011 |
| WO | 2006027409 A2 | 3/2006 |
| WO | 2007132089 A2 | 11/2007 |
| WO | 2009029863 A1 | 3/2009 |
| WO | 2009/065445 A1 | 5/2009 |
| WO | 2010081873 A1 | 7/2010 |
| WO | 2011029865 A1 | 3/2011 |
| WO | 2011/077048 A1 | 6/2011 |
| WO | 2011121180 A1 | 10/2011 |
| WO | 2012170716 A2 | 12/2012 |
| WO | 2013169133 A2 | 11/2013 |
| WO | 2014001976 A1 | 1/2014 |
| WO | 2014004194 A2 | 1/2014 |
| WO | 2015/059157 A1 | 4/2015 |
| WO | 2015044523 A1 | 4/2015 |
| WO | 2015075310 A1 | 5/2015 |
| WO | 2015085186 A1 | 6/2015 |

OTHER PUBLICATIONS

European Search Report and Written Opinion dated Jul. 1, 2016 issued in corresponding application No. EP15307198; in English (17 pages).

* cited by examiner

INJECTION MOLDED PLASTIC OBJECT WITH AN EMBEDDED ELECTRONIC CIRCUIT PRINTED ON A PAPER BASE AND METHOD OF ITS PRODUCTION

DOMAIN OF THE INVENTION

Internet-of-Things (IoT) requires to embed electronics circuits into any types of objects made of different materials (paper, wood, glass, plastics, . . . ). PowerCoat® paper substrates and related paper substrates printable with electronic ink enable new flexible and light PCBs (Printed electronic circuit Boards) that can be glued as a label to any object or even better 'embedded' or laminated into other paper products (corrugated boards, paper sheets, etc). The current invention relates to the ability to embed electronic circuits, such as: communication electronics (BlueTooth, Wifi modules), sensing modules (Temperature, accelerometer, etc. . . . ), RFID (for security purpose, brand identification & security, object tracking, . . . ), Organic Solar Cells (Organic PhotoVoltaic), OLED, etc, discreetly, robustly and cheaply directly into plastic parts for several market applications, in particular IoT . . . ).

It is well known in the art to produce In Mould Labels (IML) by including a printed plastic label in the mould and making the plastic piece, for example by injection, extrusion or other techniques. In this way, the plastic piece is produced in one step. The plastic label is generally made of the same polymer as the plastic piece, or at least the material is selected in order to have a strong chemical affinity with the polymer due to its own chemical nature or by means of a chemical treatment.

The original IML technique provides integrated printed labels, without electronic functionality. The aim is purely to provide visual information on the packaging. Some functionalizations of plastic films for their embedding in plastic pieces have been described. The aim of these techniques is to provide connectors for front control panels of various domestic or technical devices.

In other fields, the integration of electronics in plastic pieces has been developed by creating electronic devices directly on or in plastic pieces by various means. One technique consists of using activable polymers in the piece itself. For example, by using polymers doped with activable copper oxides, laser activation will reduce these oxides in conductive metal and create conductive tracks. This technique can be applied for 3D objects. Another technique uses inkjet technology, which also allows direct printing on 3D pieces.

The direct engraving or printing of electronic functionalities on plastic parts, known as plastronics, has several important drawbacks. This technique is limited in terms of electronic components that can be integrated without contact. It is costly, time consuming, as it must be done on the plastic piece itself, often requires chemical bath post treatments. Print definition of the electronic parts is less powerful than printing on paper substrates (100 µm instead of less than 10 µm).

International patent application WO2009065445 (ISDI company) discloses an IML process, made of various plastic or cellulosic substrates, laminated with a transparent plastic film. This complex is then incorporated in an In Mould Process. In this patent application the embedding of electronic components, such as a chip, a transponder or the like is contemplated, by inclusion of such components between the base substrate of the label and a laminated plastic film. However, as mentioned in said application, the embedding of separately produced electronic components presents the disadvantage of adding extra thickness to the in-mould label, which may need to be compensated for. Moreover, the manufacture of such components does not match the flexibility of printed electronics. Moreover, since the teachings of said application are focused on providing an in-mould label with an outwards-facing electronic circuit beneath a laminated film, the embedded electronic components are not accessible for physical connections, require an extra lamination step for their manufacture, while it is not possible to simultaneously conceal the electronic circuit (which requires an opaque film) and provide visible graphical printing (which requires a transparent film) on the same area of the label. Further, an electronic circuit which is, as disclosed in said application, manufactured separately from the substrate and appended thereto may be later separated therefrom, which jeopardizes the safety of a label thus designed.

The use of plastic films and the mentioned embedding of functionalities on plastic films, then integrated in the plastic pieces, have several important drawbacks.

In high temperature sintering, plastic films show noticeable drop in their physical characteristics. 120° C. to 140° C. are maximum temperatures for polyethylene terephthalate (PET) and polyethylene naphthalate (PEN), whereas paper can withstand temperatures up to 200° C. to 220° C. without significant decrease in mechanical properties. Sintering is usually required for obtaining functional electronic circuits from substrates printed with electronic ink, in particular with inks comprising metallic particles. Lower temperature sintering, due to temperature constraints of the substrate, induces the need for higher amount of expensive electronic inks, in order to reach the desired electronic properties.

Due to their higher temperature sensitivity compared to paper, plastic films show a poor thermal dimensional stability. This drawback causes registration issues during the printing steps.

Plastic films are more difficult to print by basic techniques than paper. Their runnability on printing machines is difficult due to static electricity, leading to lower speed operation. The ability of the ink to dry on plastic film is much lower than on paper, due to the lack of porosity of films. This also impacts negatively the operation speeds. The adhesion of inks and therefore the resistance to set off, scratch, rub, are lower on films, due to the lack of porosity and the lower surface energy.

Plastic films show significant restrictions on adhesion to polymers of other chemical nature. As examples, polyester (in particular polyethylene terephthalate, PET), which is commonly used in the flexible printed electronic industry, has a poor affinity with polyamide (PA) and polyolefins (polypropylene, polyethylene). Polyolefins have a poor affinity with most of the common polymers used in the plastic industry. This limitation would mean that in most cases, it would be necessary to use as the base substrate for the label a film made of the same polymer as the one used for the final plastic piece. To overcome this critical drawback when producing the product, it is necessary to insert an adhesion medium between the 2 surfaces. This can be done either by coinjection, coextrusion, hot melt bonding, adhesion primer coating or any other means known by the expert. But these technical operations can be complex, are time consuming, lead to production waste and finally significantly increase the overall process cost. Moreover, polymers tend to have different thermal expansion coefficients, which lead to lack of adhesion or even separation of polymer complex or sandwich on cooling after production of the plastic piece.

BRIEF DESCRIPTION OF THE INVENTION

This section provides a brief description of the invention. Definitions and further technical details and features, as well as preferred embodiments, disclosed in the detailed description below, apply to the disclosure of this section.

The invention provides a solution to the drawbacks of the methods and products of the prior art by substituting paper-based substrates (designated paper substrates herein) for plastic film in the preparation of supports for carrying electronic functionalities such as those provided by printed electronic inks in particular. The general purpose of the invention is to embed a label essentially consisting of a paper substrate carrying electronic inks and/or a printed electronic circuit and/or device (thereby achieving a paper-based electronic circuit) directly into a moulded plastic piece (also designated as plastic object), the embedding of the paper-based electronic circuit and the production of the plastic piece being performed in a single operation.

Provided herein is a method to manufacture a plastic object embedding a paper-based circuit, comprising the steps of:
A. providing or producing a paper-based electronic circuit and a mould;
B. positioning the paper-based electronic circuit inside the mould;
C. providing liquid plastic in the mould; and
D. allowing the plastic to solidify and recovering the moulded plastic object embedding the paper-based electronic circuit;
wherein the paper-based electronic circuit carries an electronic circuit which is at least partly printed on a paper-based substrate.

The first step consists in producing or providing a paper which features good printability with special inks to make an electronic circuit. This paper can be the same as described in the patent applications WO2011077048 (or FR2954361) or WO2015059157. These papers provide excellent printability, with electronic and optionally with conventional inks. The paper may already be printed with electronic inks, and in particular may comprise an electronic circuit, at least partly consisting of printed electronic components, or may be printed with electronic inks in the first step of the method to produce a paper-based electronic circuit.

The inventors have determined that in addition to such printability, the selected papers exhibit suitable adhesion ability to the polymers used to produce the plastic object.

In a particular embodiment, the paper may be a paper available from Arjowiggins Creative Papers under the name PowerCoat®, such as PowerCoat®HD or PowerCoat®XD.

The paper may be provided already printed, or may be printed in performing the method, with special inks to obtain an electronic circuit. The printed electronic circuit may comprise both connections between devices (wiring) and devices such as capacitors, resistances, batteries, antennas, or the like, as detailed below. Depending on the type of functionality required, additional non-printed electronic components may be appended to the electronic circuit, such as chips, LEDs, resistances, capacitors and more generally all kinds of electronic components. These components can be appended to the electronic circuit by pick and place process and are put together by soldering. Additionally, the paper can be printed to include graphical design, written information or any visual message.

Optionally, the printed paper can be laminated with a plastic film and/or coated with a plastic layer, on one or two sides, in order to improve the adhesion of the label on the plastic piece when the lamination or coating takes place on the side in contact with the plastic piece, and/or to improve the protection of the label on the side that will be the outside of the plastic piece. In the case where the plastic film is laminated or when the plastic layer is coated on the inner surface of the substrate and is intended to be in contact with the plastic piece, the plastic is preferably selected in the same polymer as the one used for making the plastic piece, in order to maximize adhesion during the production of the plastic piece.

In preferred embodiments, alternative to embodiments mentioned in the previous paragraph, the in-mould label does not comprise any plastic film, i.e. is devoid of any plastic film and in particular is devoid of any plastic material or coating. In particular embodiments, no plastic film is intercalated between the paper-based substrate and the plastic piece, the paper-based substrate being in direct contact with the plastic material of the plastic piece during and after moulding. In particular embodiments, no plastic film is laminated or otherwise overlaid on the outer surface of the in-mould label, the paper-based substrate being directly accessible at the surface of the plastic object after moulding.

Once this paper-based electronic circuit is obtained, the goal is to embed this label in a plastic piece during the making of the piece/object. The label is placed into the mould and then the introduction of the melted polymer is realized. In this way, there is no additional step during the manufacture of the plastic piece.

The result is a plastic piece including a circuit with electronic features, including printed electronic features, and possibly a printed design or message, that has been obtained without significant increase in lead time production. Additionally, in the case where the circuit is on the outside and has not been protected by lamination of a plastic film, this circuit may further be physically connected to any device.

According to a particular embodiment, the summarized method of the invention consists of or comprises the steps of:
Providing a paper substrate that is suitable for or designed with special properties in order to be printable for electronic printing and optionally for graphical printing, such as for example a paper described in international patent application WO2015059157 or another paper described in international patent application WO 2011/077048 and European patent EP2516741 B1.
Printing said paper by any appropriate means in order to apply ink with electric/electronic properties and form an electronic circuit on the paper. Non-printed electronic components may be additionally appended to the circuit. In an additional optional step, heating the printed paper at high temperature to sinter the ink particles.
Optionally, graphically printing said paper by any means to provide visual communication with a design or a message.
Optionally, laminating a film or applying a coating on one or on two sides of the paper-based electronic circuit, in order in particular to improve the affinity of the paper-based electronic circuit with polymers of the plastic piece, achieving a better adhesion of the label with said polymer and/or to provide physical protection against chemical, physical or optical attack.

Finally, embedding the in-mould label on (or in) a plastic piece. It is placed inside a mould in a press, the mould is closed, the melted polymer is injected or provided by any suitable technique into the mould, the mould is opened and the plastic piece is retrieved with the embedded paper-based electronic circuit.

As mentioned above and in more detail below, the paper provided in the first step of the method may already carry a printed electronic circuit (which may have been subjected to a step of sintering) and optionally non-printed additional electronic components, a graphical printing, and/or a plastic film and/or coating on one or two sides in which case the corresponding steps above may be omitted from the method. In some cases, the paper-based electronic circuit may be provided ready-to-use (with a printed electronic circuit and any other required feature) and the method may start with the positioning of the paper-based electronic circuit in the mould.

Figure 1:
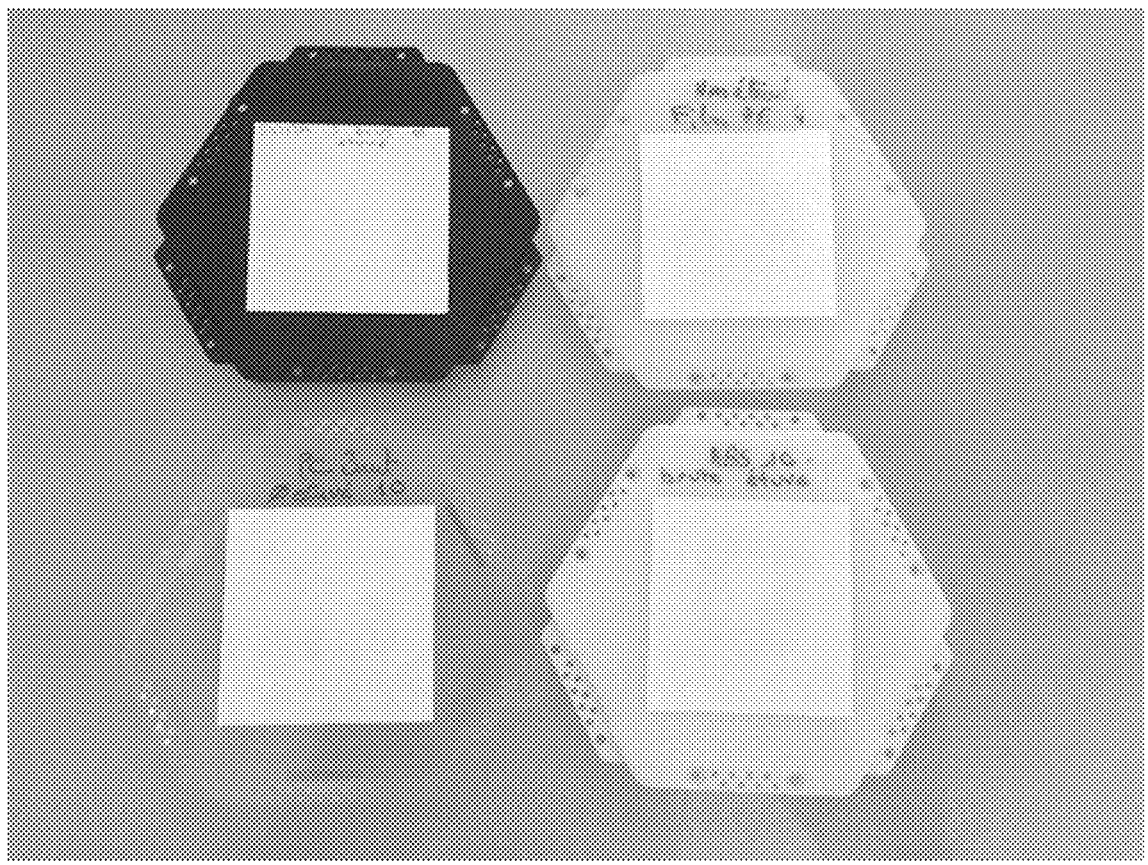
FIG. 1 Samples on PMMA, PE, PC and ABS
Figure 2:
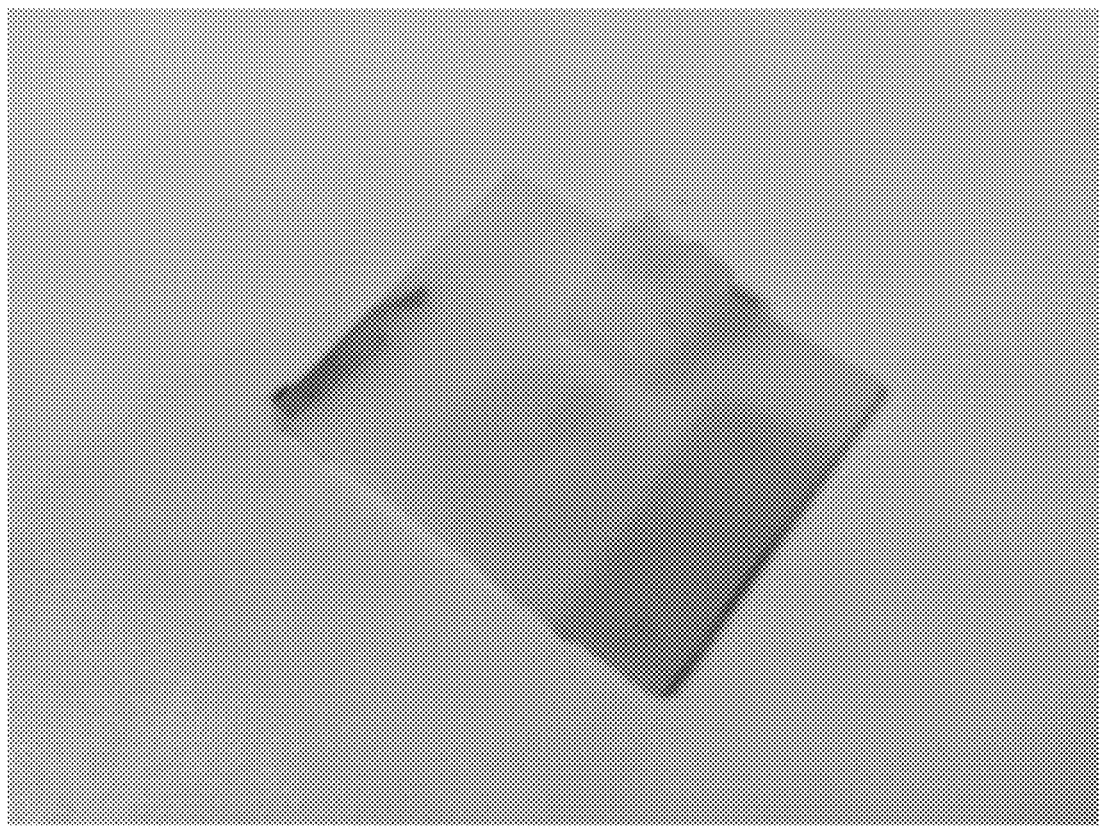

Samples of plastic pieces with embedded "Powercoat XD" paper-based electronic circuits, obtained as disclosed in the Examples section. Circuits are on the inner surface. Top left, PMMA-based label as disclosed in example 19. Bottom left, PC-based label as disclosed in example 20. Top right, PE-based label as disclosed in example 32. Bottom right, ABS-based label as disclosed in example 23.

FIG. 2

Sample RFID printed antenna on Powercoat XD paper, embedded on a polyamide (PA6.6) object, as disclosed in example 26.

DETAILED DESCRIPTION OF THE INVENTION

Provided herein is a method to manufacture a plastic object embedding a paper-based circuit, comprising the steps of:
A. providing or producing a paper-based electronic circuit and a mould;
B. positioning the paper-based electronic circuit inside the mould;
C. providing liquid plastic in the mould; and
D. allowing the plastic to solidify and recovering the moulded plastic object embedding the paper-based electronic circuit;
wherein the paper-based electronic circuit carries an electronic circuit which is at least partly printed on a paper-based substrate.

The term "plastic" is used herein as a noun with its usual meaning in the field of materials, i.e. it designates synthetic or naturally occurring polymers, essentially amorphous organic polymers with high molecular weight, particularly derived from petrochemicals or from biological sources, which may comprise additional substances. In particular, plastics encompass thermoplastics, elastomers and thermosets. The term "plastic polymer" is used interchangeably herein with the term "plastic". "Polymer" alone is sometimes used with the same meaning as when the context makes it clear that it refers to a plastic polymer. When used as an adjective, the term "plastic" indicates that the material referred to is made of (or essentially made of) plastic, rather than to a mechanical property (plasticity), unless the context clearly sets otherwise. A "plastic film" as used herein designates an essentially two-dimensional material (i.e. essentially extending in two directions, with a typically very small measurement in the third direction) formed of a continuous plastic polymer, in particular a thermoplastic polymer, which generally possesses strong intrinsic mechanical cohesion. In particular, a plastic film may be a film obtained by extrusion of a plastic. Alternatively, a plastic film may be formed by calendering a plastic polymer.

The polymer used for making the plastic piece can be selected within the thermoplastic material family. Such thermoplastic material can be in particular polyester (in particular polyethylene terephthalate, PET, polybutylene terephthalate, PBT, polyethylene naphthalate, PEN, polylactic Acid, PLA, polyhydroxybutyrate and their copolymers), polyamide (in particular PA 6, PA 6.6, PA 6.10, PA 6.12, PA 11, PA12 and their copolymers), polyethylene (PE) in all its variations, based on density, molecular weight or branching (for example: low, medium or high density, linear or branched, high, ultra high, low, ultra low molecular weight and all their combinations), polypropylene, polycarbonate (PC), polystyrene (PS), polymethylmethacrylate (PMMA, including its modifications with comonomers such as methacrylic acid, acrylate, butyl acrylate), Acrylonitrile Butadiene Styrene (ABS), polyvinylchloride, polyether Sulfone, polyetherether Ketone, polyetherimide, polyphenyleneoxide and other less common grades. Biodegradable polymers may also be used, in particular polylactic acid (PLA). In preferred embodiments, the polymer used for making the plastic piece is selected among the group consisting of polyester (PET), polymethylmethacrylate (PMMA), polycarbonate (PC), polypropylene (PP), acrylonitrile butadiene styrene (ABS), polyamide 6.6 (PA) and polylactic acid (PLA).

As used herein, the paper-based substrate, also referred to as paper substrate, designates a printable paper, in particular printable with electronic inks, which may present coatings, surface treatments, etc, and is not necessarily exclusively made of cellulose. The paper substrate comprises fibrous material, in particular cellulosic fibres. In particular embodiments, the paper substrate comprises cellulosic fibres. In particular embodiments, the paper substrate comprises synthetic fibres. In particular embodiments, the paper substrate comprises both cellulosic and synthetic fibres. In preferred embodiments, the paper-based substrate does not comprise any plastic material and/or does not comprise any plastic film.

The paper substrate may have any thickness, the thickness thereof being only limited by the printability and suitability as in-mould-label. Some printing methods, in particular in conventional industrial setups, have relatively strict thickness requirement, while other methods, including methods suitable for electronic printing, may apply to substrates of widely varying thickness. Similarly, depending on the plastic object, the thickness of the embedded label may be relatively unimportant, or quite constrained. However, generally, and in particular since the label is generally either embedded in the object or embedded on the surface of the object, the surface of the label being "flush" with the surface of the object, and its thickness therefore does not protrude, the thickness of most printable sheets will be suitable for embedding as a label. In particular embodiments, the paper substrate has a thickness equal to or higher than 80 µm, preferably equal to or higher than 90 µm. In particular embodiment, the paper substrate has a thickness equal to or higher than 150 µm, preferably equal to or higher than 200 µm. In particular embodiments, the paper substrate has a thickness equal to or lower than 500 µm, preferably equal to or lower than 300 µm, even more preferably equal to or lower than 250 µm. In particular embodiments, the paper substrate has a thickness equal to or lower than 200 µm or equal to or lower than 150 µm. Particularly preferred values for the thickness are 95 µm, 125 µm, 200 µm, 230 µm. The thickness mentioned in the present paragraph must be understood to be the thickness of the paper-based substrate as it is prior to moulding, i.e. the thickness of the ready-to-use in-mould label, comprising the paper substrate itself, and any overcoats and printed layers, including the electronic circuit, paper coatings, etc.

In preferred embodiments, the printable paper substrate used in the invention is a multilayer substrate that may present as a printable sheet and that does not comprise any plastic film.

This paper can advantageously be one disclosed in patent applications WO2015059157 or WO 2011/077048 (or FR2954361) and in particular can be treated, at least on one side, in particular by a treatment according to the description made in said patent applications. This treatment provides the paper with one or two surfaces printable by various printing techniques such as offset, gravure, flexography, xerography, screen printing, inkjet or any other printing technique.

In a particular embodiment, the paper may be a paper available from Arjowiggins Creative Papers under the name PowerCoat®, such as PowerCoat®HD or PowerCoat®XD. Suitable papers may be obtained by gluing a paper substrate on a multilayer structure comprising a paper coating and/or a printable varnish, a separation layer and a smooth plastic film, so that the coating and/or varnish remain on the paper substrate after removal of the plastic film and separation layer, while the smooth surface of the plastic film is efficiently transferred to the coating and/or varnish. A printable sheet with excellent smoothness and gloss is thereby obtained, which does not comprise a plastic film and has excellent printability with electronic inks. The gloss and/or smoothness of such paper is particularly suitable for an in-mould label, where it may either match the smoothness and/or gloss of the remainder of the surface of the plastic object, which provides for seamless integration of the label, or contrast with the smoothness and gloss of the surface of a textured, rough or matt plastic object, improving the visibility of the label, in particular when the label is graphically printed. The absence of a plastic film within the paper-based substrate makes for optimal thermal stability (in particular dimensional stability). The Powercoat® HD paper mentioned above is one such paper.

In particular embodiments, the paper substrate has a Bekk smoothness equal to or higher than 900 s, preferably equal to or higher than 2000 s. In particular embodiments, the paper substrate has a gloss, measured at 75° (e.g. according to the Tappi® T480 om-92 or om-09 standard) of 70% or more, preferably of 80% or more. The Powercoat® HD paper mentioned above is one such paper.

Alternatively, suitable papers may be obtained by coating a paper with a layer consisting of or comprising: 100 parts by weight of dry pigment; 5 to 50 parts by dry weight of one or more binders resistant to exposure to temperatures in a range of 140° C. to 200° C. and having a glass transition temperature below 20° C., in particular of one or more acrylic binders having a glass transition temperature that is less than or equal to 20° C., preferably less than or equal to 10° C.; and from 0 to 15 parts by dry weight of thickening agent, such as for example polyvinyl alcohol. The low glass transition temperature of the binder used in such papers allows for improved dimensional stability, in particular at temperatures used for the moulding step. The Powercoat® XD paper mentioned above is one such paper.

The dimensional stability of the substrate is an advantage for the manufacture of a in-mould label. This is favoured by the presence of short cellulosic fibers. In particular embodiments, the paper substrate may comprise 70% to 90% by dry weight of short cellulosic fibers. The Powercoat® XD paper mentioned above is one such paper.

Papers with high brightness (or whiteness) have a greater trend to noticeably yellow when heated. The brightness may refer to ISO brightness measured according to ISO standard 2470-1 (in particular 2470-1:2009 or 2470-1:2016) and/or D65 brightness measured according to ISO standard 2470-2 (in particular 2470-2:2008). Since the label in the present invention is necessarily submitted to heating (at least for moulding, and in preferred embodiments for sintering as well), it is desirable that the colour of the label is not noticeably altered by heating. In particular embodiments, the brightness of the paper of the label is in the range of 70 to 90, preferably 75 to 85. In preferred embodiments, the yellowing after curing of the paper substrate (i.e. the difference in brightness before and after curing) is equal to or less than 3 after 5 min curing at 180° C. In particular embodiments, the paper is devoid of optical brightening agents. The Powercoat® XD and HD papers mentioned above are such papers.

These papers can be printed by electronic inks on the coated side(s) (or one of the coated sides) in order to provide electronic features. These papers can be printed by normal inks on the coated side and/or on the opposite side in order to provide graphic communication. These papers are designed in order to provide a good dimensional stability versus temperature and moisture change. These papers are designed in order to withstand the high temperatures required for electronic ink sintering, up to 300° c.

If the in-mould label is intended to be embedded on the surface of the plastic object, the label will have one side in contact with the plastic object, referred to herein as the inner surface and one side facing outwards (i.e. which remains visible and/or otherwise physically accessible) after embedding on the object, referred to herein as the outer surface. If the in-mould label is intended to be embedded inside the plastic object, with no outwards facing side (such as through the two-step moulding mode disclosed herein), both of its sides will have the features of inner surfaces. Therefore, features disclosed in respect of the inner surface herein—even if mentioned in the singular form—are to be understood as applying to both surfaces of an in-mould label intended for (or suitable for) embedding inside a plastic object.

In particular embodiments, the method of the invention comprises a step of producing a paper-based circuit. As used herein, producing a paper-based electronic circuit will usually comprise at least a step of providing a paper-based substrate and a step of printing at least part of an electronic circuit, as detailed below. The preparation of the paper-based electronic circuit may also comprise any additional steps mentioned below or otherwise known to the skilled person for the preparation of a paper-based electronic circuit and/or an in-mould label, e.g. a step of appending non-printed electronic components, a step of graphical printing, a step of overcoating the label, etc.

In particular embodiments, the method of the invention comprises a step of printing the paper substrate with electronic inks, referred to as the "electronic printing step", or "electronic printing". The paper is electronically printed on the dedicated side, which may be either the inner side or the outer side depending on the type of circuit/device and the intended application, with electronic inks that will cover partly or totally the surface. In particular embodiments, the paper may also be electronically printed on both sides. This printing step can be achieved by using appropriate printing techniques, such as flexography, screen printing, offset printing, rotogravure (also referred to herein as gravure printing), inkjet printing, xerography (also referred to as electrophotography and encompassing laser printing) or any other traditional or digital printing technique. Conductors, resistors, capacitors, antennas, batteries and many other electronic components can be achieved by this method.

"Electronic inks", refers herein to inks conventionally used in the field of printed electronics, and is readily identifiable by a skilled person. In particular, an electronic ink has suitable electric and/or electronic properties, in particular conductance, resistance, and/or impedance properties and/or dielectric, semiconducting, photovoltaic and/or electroluminescent properties. Electronic inks comprise organic and inorganic inks. Organic inks comprise conductive polymers, polymer semiconductors, in particular conjugated polymers. Inorganic inks comprise in particular dispersions of metallic or semiconducting particles, in particular micro and nanoparticles, in particular silver and/or gold particles and/or particles comprising silicon or oxide semiconductors.

The method of the invention preferably comprises a step of sintering, following the electronic printing step. Once the inks are applied and dried if necessary, a step of sintering at high temperature takes place, in order to sinter the small particles in the ink and achieve or improve electronic properties. As an example, for conductive inks, small metal particles are included in the ink that need to be, at least partly, melted or sintered in order to increase significantly the electric conductivity. Compared with common plastic films used in these applications as PET, these papers provide a much better thermal resistance and can be sintered at much higher temperatures, for example 200° C. compared to a maximum of 120° C. to 140° C. for PET. In particular cases, this leads to much better electric/electronic properties with the same ink deposit or allows to use much less ink in the deposit to achieve the same electric/electronic properties. This is a very significant advantage with some inks, especially conductive inks, made of expensive raw materials such as silver nanometric powder.

The electronic printing step and/or the sintering step may be performed prior to the method of the invention, i.e. in particular embodiments an electronically printed (and optionally sintered) paper-based electronic circuit is provided as starting material for the method of the invention. Features disclosed in relation to the electronic printing steps herein are also disclosed in relation to such provided labels, inasmuch as the features of the manufacturing steps of the printed label are carried over to the product, as the skilled person will realize (e.g. presence of silver within the printed ink, of appended non-printed components as disclosed below, etc).

In particular embodiments, the in-mould label, prior to its embedding in the plastic object, on the outer surface and/or on the inner surface(s):
  carries a printed electronic device and/or circuit; and/or
  carries electronic inks, in particular inks with suitable electric conductance, resistance, impedance and/or inks comprising metallic particles, in particular nanoparticles, in particular silver nanoparticles.

The thus obtained label is interchangeably referred to herein as an in-mould label, a tag, a paper-based electronic circuit or a paper circuit. The term "electronic circuit", as used herein, designates any electronic device or fraction thereof comprising printed elements, i.e. elements obtained by deposition of electronic ink on a paper-based substrate by a printing method, the function of such printed elements being achieved through their topological arrangement, generated by the printing step. In particular, at least part of the electronic circuit is intimately adsorbed on the printing surface and these parts have very little if any mechanical cohesion independently of the paper substrate. As disclosed in more detail below, such an electronic circuit may also comprise non-printed components (or elements). The term "circuit" is sometimes used herein alone and conveys the same meaning as "electronic circuit".

The term "printed electronic circuit" refers to the printed elements of the electronic circuit, exclusive of any additional appended elements (as detailed below). However, in certain cases, features disclosed in relation to the printed electronic circuit may apply as well to additional elements and in particular may apply to the entire electronic circuit, as the skilled person will establish from the context.

The singular term electronic circuit generally refers to a single closed functional electronic device. However, in the present disclosure the term will be used in the singular form even when referring to several distinct circuits, whether intended to be used in several labels comprising one circuit each, or intended to be used on a single label (or several labels) comprising several circuits. The skilled person will appreciate that features disclosed in relation to a circuit apply similarly to one or to several circuits depending on whether the design of the label (or the manufacturing steps thereof) calls for one or several circuits to be produced on said label (or during the manufacture of said label). In particular embodiments, the electronic printing step (and/or the graphical printing step detailed below) may be performed on a single substrate (in particular a single sheet of paper or a single roll of paper) intended to be used to manufacture several labels and in particular the electronic printing step (and/or graphical printing step) is followed by a step of cutting the printed substrate in separate labels, prior to their positioning in the mould. In such embodiments, several circuits will be printed on the substrate, which may be identical or different.

Similarly, if the electronic components on the label (including the printed electronic circuit and any non-printed components) do not form a functional electronic circuit by themselves (e.g. for the lack of a battery or other source of energy, and/or for the lack of an interface, or any other element), in particular in cases where the functionality may only be achieved by contacting the in-mould label with an external element, the term electronic circuit will designate the fraction of the functional electronic circuit which is on the label embedded on or in the plastic object, regardless of whether it is autonomously functional. In cases where the electronic circuit comprises non-printed components, the printed electronic circuit usually does not (although it may) form an autonomous functional circuit, and the term printed electronic circuit must be understood to refer to the printed part of the circuit, regardless of the functionality of the printed part alone, or of the circuit as a whole.

Generally, the circuit can be described as comprising a number of electronic components (including electric components conventionally used in electronic circuits such as batteries, switches, etc.) connected together by wiring, in particular conductive wiring. In the field of printed electronics, the wiring usually lends itself optimally to printing. In particular, the printed electronic circuit comprises the wiring of the circuit. Other more complex components may be obtained by printing, as known in the field. The printed electronic circuit may therefore additionally comprise part of the electronic components, or the entire electronic components. In particular, components such as transistors, diodes, antennas, chips, organic light-emitting diodes (OLEDs), photovoltaic cells, batteries, etc. may be printed. Complete functional devices may be obtained exclusively by printing, including RFID tags (including the transponder and antenna components), memories (including addressable memories), OLED displays and OLED lighting devices, etc.

The term electronic circuit, as used herein, usually does not comprise the substrate carrying the electronic elements. However, the skilled person will appreciate, given the context, that the term (in particular e.g. when used in the expression paper-based electronic circuit or paper circuit) may refer to both the circuit and its carrying substrate. The skilled person will also appreciate that the "[in-mould] label" or "tag" referred to herein will in most contexts comprise the circuit printed on the substrate, as well as any additional components of the circuit (and, where applicable, any coating or film covering the circuit and/or surface of the paper substrate, such as an overcoat as disclosed herein).

An advantage of the invention is the possibility it offers to embed an electronic circuit which does not substantially affect the thickness of the label, its thickness being essentially negligible compared to that of the substrate. In particular embodiments, the electronic circuit, device and/or ink deposits, in particular the printed electronic circuit, are not thicker than 200 µm, preferably not thicker than 50 µm, preferably not thicker than 20 µm. Typically, the thickness of electronic ink printing is in the order of magnitude of 10 to 20 µm for screen printing, 2 to 3 µm for flexography and around 0.3 µm for inkjet.

In particular embodiments, all of the components, or essentially all of the components, or at least some of the essential components of the electronic device or circuit are manufactured directly by printing on the in-mould label prior to its embedding in the plastic object, and in particular are not pre-assembled prior to their contacting the paper-based substrate. In addition to the very low thickness of electronic ink circuits, such electronically printed papers offer improved security over separately-produced circuits affixed to a label: indeed, it is not possible to separate a printed electronic circuit from its substrate and therefore physically tampering with the label is made nearly impossible, even in cases where the circuit is on the outer surface and unprotected (by e.g. a plastic film) and thus directly physically accessible.

The method of the invention may comprise a step of appending electronic components to the printed electronic circuit to provide additional features. These electronic components are generally very small components including elements whose size would not be achievable by printing techniques, such as integrated circuits (chips), LEDs, resistances, capacitors, or many others. This operation may be performed by pick and place process. Such a method comprises the picking and placing of the component onto the circuit and the soldering of the component using paste or special adhesive by heating or radiation treatment (wave, reflow). This process is known from the skilled person as a common process used in traditional Printed electronic circuit Board (PCB).

In particular embodiments, the method of the invention comprises another step of printing, referred to herein as the "visual printing step", or "visual printing", or "graphical printing". In this optional step, the papers can be printed with standard inks in order to bring printing communication and information to the labels in their final application. As does paper in general, these substrates provide outstanding printing features when compared to plastic films. Their print quality is much higher than that of plastic films, their runnability is much higher in terms of printing press speed, slip control, static electricity, ink drying time and finally, thanks to these advantages, much lower operating costs. The visual printing step is preferably performed on the outer surface only, since printing on the inner surface will result in the printed design being invisible. It is however contemplated to visually print the inner surface of the in-mould label, e.g. for production, logistics, etc purposes, in particular with visual indications which are not required to be visible on the finished plastic object.

The visual printing step may be performed using any printing technique, in particular offset printing, gravure printing, flexography, xerography (or electrophotrography, in particular laser printing using liquid or solid toners, in particular HP indigo printing), screen printing and/or inkjet printing. The printing may be performed on a coated or uncoated side of the label.

The visual printing step may be performed at any time before the moulding of the plastic piece, and preferably before the introduction of the label in the mould. Therefore, in some embodiments the method of the invention comprises a visual printing step before the electronic printing step. In other embodiments, the method of the invention comprises a visual printing step after the electronic printing step. This visual printing step can be performed after or before the sintering of the electronic inks.

In particular embodiments, a visually printed paper is provided for the method of the invention, i.e. the visual printing step was performed prior to performing the method of the invention. Naturally, it is conceivable to use a printed paper as starting material and to still include an additional printing step in the method.

In particular embodiments, the method of the invention comprises a step of laminating a plastic film on at least one side of the label and/or a step of coating at least one side of the label with a layer of plastic. Any such step is designated herein as a step of "plastic overcoating" and the layer or film is designated as a "plastic overcoat", regardless of the application method of the layer or film, and regardless of the mechanical or physical nature of the layer or film (in particular, for the sake of clarity, both laminating and coating are encompassed in the term overcoating and both a laminated plastic film and a coated plastic layer are encompassed in the term plastic overcoat).

The step(s) of overcoating is (are) performed only if required. Indeed it is easier and less expensive to use the label directly in the plastic piece manufacturing process. However, plastic overcoating may be performed in particular to improve adhesion of the in-mould label with the plastic object and/or to improve resistance of the outer surface and in particular durability of the visual printing and/or of the printed electronic circuit.

With a small number of the plastic polymers used in manufacturing plastic pieces, the adhesion between the paper and the polymer may be too low and therefore a plastic overcoat of the same chemical nature (or of a chemical nature improving adhesion, as detailed below) as the one of the plastic piece may be required in order to optimize adhesion. This might be the case with some polyolefins, such as polyethylene, which are known by skilled persons to offer poor adhesion to a great variety of other materials. A plastic overcoat designed to (or suitable for) improving adhesion of the paper-based electronic circuit to the plastic object is termed hereinafter an "adhesion-improving overcoat". In particular embodiments, when needed, a step of plastic overcoating improves affinity between the label and the plastic piece when the plastic overcoat is applied on the inner surface of the label. In particular embodiments, the adhesion-improving overcoat is made of a plastic polymer preferably of the same nature as the polymer of the plastic piece. In particular embodiments, the adhesion-improving overcoat is made of a plastic polymer known as having a good affinity with the one of the plastic piece. Whatever the plastic used for the plastic piece, adhesion will generally not be an issue if the in-mould label is embedded inside the finished plastic piece and no adhesion-improving overcoat will generally be required on the in-mould label in such cases.

In other embodiments, when the label is placed on the surface of the plastic piece (i.e. when it is not completely embedded within the plastic piece), there may be a need for additional protection of the outer surface from outside aggression. In this particular case, a plastic overcoat may be applied on the outer surface of the in-mould label, which brings a protection to the label against external aggressions: scratch, light, water, chemicals, gaz. A plastic overcoat designed to (or suitable to) protect the in-mould label from external aggression is termed hereinafter a "protective overcoat". The skilled person can readily choose the composition of the plastic depending on the specific objective. The protective plastic overcoat may protect the printed graphics and/or the circuit, in cases where the circuit is on the outer surface of the label. In particular when visual printing was performed on the in-mould label and is intended to be visible in the moulded plastic piece, the protective plastic overcoat is transparent.

It is also possible to apply a protective overcoat over only part of the label, e.g. to protect part of the circuit and/or of the printed graphics, while allowing physical contact with another part of the circuit. This may be achieved by methods known to the skilled person, and in particular by laminating a film comprising a cut-out corresponding to the part of the label that is intended to remain physically accessible, or when a coating is applied, to apply such a coating in a pattern which does not cover said part of the label, as readily achievable by e.g. gravure coating.

When both the inner and the outer surfaces are laminated with a plastic film and/or coated with a plastic layer, the plastics may be identical or different in composition. It is also considered to apply several plastic overcoats (in particular laminated film and/or coated layer) on a single surface.

In an alternative embodiment, a single film, made in a plastic identical to or showing good affinity for the plastic of the object, is laminated on the outer surface of the in-mould label and extends beyond the surface of said label. Such a laminated film may present advantages of both an adhesion-improving and a protective overcoat: the film covers the entire outer surface of the label (or the fraction thereof which is intended to be protected) and therefore provides protection, while parts of the film extend beyond the label and are therefore in direct contact in the mould with the plastic object being manufactured, providing for good adhesion of these parts of the film. The extension of the film may surround the paper-based electronic circuit completely and adhere to the plastic object, so that the paper substrate is practically retained on the plastic object even if the adhesion to the plastic object of the paper substrate alone is insufficient.

Laminating a film can be operated in roll or in sheet.

In roll process, a laminator is used. A reel of the paper, printed with the electronic circuits and possibly with the printed mentions or communication messages, as described above, is unwinded. The selected plastic film is unwinded on another unwinder. Glue is applied on the plastic film or on the paper and the 2 sheets are laminated together between 2 rolls in contact. If needed, the complex is dried in a drying unit or cured and finally, the complex is rewinded. This roll to roll technique provides a high speed operation and a very economical process.

In sheet, the glue, of same types as glue in roll to roll process, can be applied on the paper or on the film by any appropriate means, as for example screen printing, rod or blade coating, spray coating. Then the second part of the complex without glue is applied on the first part coated with glue. A close and homogeneous contact is provided by applying a heavy roll on the upper surface or by making the complex passing into the nip of 2 turning rolls. In a same way as for roll to roll process and according to the choice of the glue, the complex is then dried in the required conditions.

The glue can be selected among the adhesives known by the skilled person. One family consists in vegetable origin glues, such as starch, dextrin, carboxymethylcellulose (CMC), galactomannanes, or the like. Another family of glue is extracted from animals such as fish glue, gelatin, casein or the like. Synthetic products are now widely used. They are based on thermoplastic polymers such as acrylic, polyvinyl acetate, polyvinyl alcohol and almost any kind of thermoplastic polymers. Thermoset resins are also widely used: they include polyurethane, melamine, epoxy, polyesters, rubber and the like. These glues can be water based, in solution for soluble products such as starch, polyvinyl alcohol, CMC, galactomannane, gelatin or in emulsion for the other synthetic polymers. These glues can be solvent based. In this case, materials are in solution, for almost all synthetic products.

In particular embodiments, the in-mould label, prior to its embedding in the plastic object, consists essentially of the printed paper substrate, possibly with coatings (including an overcoating as disclosed below) but is devoid of any plastic film and in particular, any overcoats if present do not comprise a plastic film. Indeed, as illustrated herein, with a wide variety of plastic materials, the adhesion of the paper-based electronic circuit to the moulded plastic is sufficient without the requirement for a plastic laminate (or glue).

In particular embodiments, the outer surface of the in-mould label prior to its embedding in the plastic object consists of a printed or non-printed surface of the paper substrate, possibly with overcoating, but is not covered (in particular is neither entirely nor partly covered) by any plastic film. In particular embodiments, the outer surface of the in-mould label bound to the plastic object consists of a printed or non-printed surface of the paper substrate, possibly with protective overcoating, in particular coating required or beneficial for printing, stability, visual appearance, and is not covered (in particular is neither entirely nor partly covered) by any plastic film. In particular embodiments, the label has high smoothness and/or gloss in the absence of a plastic film. An overcoat may also be used to provide hydrophobicity to the outer surface of the in-mould label without the use of a plastic film.

In particular embodiments, no adhesive is used to bind the in-mould label to the plastic object. In particular embodiments, the inner surface of the in-mould label prior to its embedding in the plastic object consists essentially of a printed or non-printed surface of the paper substrate, possibly with overcoats required or beneficial for printing, stability, functionality of the electronic circuit or device but which do not substantially improve, or are not intended to improve, adhesion of the paper substrate to the plastic object. It is particularly advantageous to avoid the use of glue or adhesive to bind the in-mould label to the plastic object, as glues or adhesives may interfere with the moulding process, e.g. by degassing during the moulding step.

Applying a selected product to the side of the label that will be in contact with the plastic piece imparts a good affinity with the polymer of the plastic piece. The product to apply to the surface of the label is selected in order to improve adhesion to the polymer of the plastic piece. Silanes and organosilanes are known by the skilled person as products that can impart adhesion between polar materials and polymers, both thermoset and thermoplastic. Other chemicals can also improve adhesion if they have chemical affinity with the polymer. For most of the polymers that are used in plastic moulding, chemicals of same nature will enhance adhesion. Among many others, these products mentioned below will improve adhesion between paper and the considered polymer, and are therefore preferred constituents of the adhesion-improving overcoat:

- for polymethylmethacrylate (PMMA) plastic objects: acrylate polymers and copolymers including acrylate such as styrene-acrylate, acrylate-acrylonitrile and other copolymer including acrylate, in waterborne latex form or in solution in solvents;
- for polystyrene (PS) plastic objects: styrene copolymers, such as styrene-butadiene and styrene-acrylate binders, in latex form or in solution;
- for Acrylonitrile Butadiene Styrene (ABS) plastic objects: all copolymers including at least one of the ABS monomers, styrene, butadiene, acrylonitrile but also acrylate and all its derivatives;
- for polyamide plastic objects: polyamide adhesives in water dispersion or solvent solution;
- for polyester (in particular PET and polybutylene terephthalate, PBT) plastic objects: saturated polyesters in water dispersion or solvent solution;
- for polycarbonate plastic objects: acrylate and all its derivatives;
- for polyethylene and polypropylene plastic objects: polyethylene or polypropylene in dispersion form, in wax form in water based products or in solution in solvents.

As will appear to the skilled person, the paper-based electronic circuit provided in step A may be provided with an overcoat. Paper-based electronic circuits comprising a plastic overcoat as defined herein, in particular an adhesion-improving and/or a protective overcoat, and suitable for use as in-mould label in a method of the invention (in particular suitable to use in step B without any additional preparation step), are provided herein as part of the invention. In particular, provided herein are paper-based electronic circuits of which at least one side comprises a laminated plastic film. In particular, provided herein are paper-based electronic circuits of which at least one side, intended to become the outer surface of the an in-mould label, comprises a laminated plastic film, in particular wherein such film does not cover the entire surface of the label, allowing for physical access to parts of the circuit and/or wherein such film extends beyond the surface of the paper-based substrate and in particular extends beyond said surface in every direction, so that it comes in contact with the plastic provided in step C.

The method of the invention comprises a moulding step. Once the in-mould label is ready to use, it can be incorporated in the plastic piece it has been designed for. This incorporation can take place in various processes of production of plastic pieces. Injection, extrusion, thermoforming, rotomoulding are techniques for the production of plastic pieces by which embedding of a paper-based electronic circuit can be realized without significant modifications of the basic process. These techniques concern mostly thermoplastics. Embedding of paper-based electronic circuits presented as in-mould labels can also be used with thermoset resins, with pressure moulding for example.

The paper-based electronic circuit is said to be "embedded" since it is strongly bound to the plastic piece and therefore may be considered to be an integral part thereof. In cases where the paper-based electronic circuit remains at the surface of the finished plastic piece, it is generally said herein to be "embedded on" the plastic piece, whereas in cases where the label is entirely (or mostly) inside the finished plastic piece, it is generally said herein to be "embedded in" the plastic piece. However, the terms "embedded on" or "embedded in" should not be considered limiting to either case, and features are disclosed exclusively in relation to one of these two situations only when explicitly specified (e.g. by specifying that the label is at the surface of the plastic piece or, conversely, fully, or almost fully embedded within or inside the plastic piece). The label is said to be "almost fully embedded" within the plastic piece when the majority (in particular more than 90% and more particularly more than 98%) of the total surface of the label is inside the plastic piece, e.g. when only the edge of the label is at the surface of the plastic piece, or when only a very limited fraction of the label's surface is accessible from the outside, in particular when pits with small surface section extend from the surface of the plastic piece to the label, in particular such pits left after moulding by devices used to maintain the label during moulding.

The obtained object is a plastic piece with an embedded label. The plastic piece is interchangeably designated plastic object herein. As will clearly appear to the skilled person, further manufacturing steps may be performed and/or required to obtain a finished product, depending on the application. In particular, the circuit carried on the label may require and/or be suitable for programming or otherwise electronically storing or retrieving data, either by wireless (and/or contactless) communication or by contacting the circuit (in this latter case, provided said circuit is on the outer surface).

In order to maintain the label in the mould while supplying the polymer, in particular during the injection of the polymer, the mould can be adapted by creating wedges, or ridges, around the area where the label has to be placed. These ridges are made of lines of where the thicknesses of the mould is slightly increased, forming an abutment (or block) preventing the label from lateral movement. They can have a low increase in thickness, such as 50 to 200 µm, in order not to modify significantly the shape of the plastic pieces. Depending on the shape of the plastic piece and the intended position of the label in the finished piece, it can be necessary to create a space for the label inside the mould, in order to maintain the label at its original position during the introduction of the polymer. The label-positioning space may be such that the tag is at the surface of the plastic piece after moulding, resulting in excess thickness of the finished piece corresponding to the tag. Positioning structures in the mould, such as those described above and in particular positioning wedges are well known to the skilled person and may be designed according to specific needs. In particular embodiments, the tag is positioned in the mould by means of positioning structures in the mould. In particular embodiments, the positioning structures are ridges and/or blocks in the shape of the mould.

Depending on the shape of the piece, the tag area can be placed horizontally, vertically or at any appropriate angle on the outside of the piece. In cases where the tag is placed at the bottom of the mould, it is generally not required to maintain the tag in position, as the flowing of the plastic polymer provided for moulding will usually not move the label. However, in particular in cases where the label is placed elsewhere or where no wedge or other positioning structure is built-in the mould, the label can be temporarily fixed by any means known by the skilled person, such as using static electricity or applying vacuum, before and during introduction of the polymer. The vacuum process requires small holes in the mould, in the area covered by the label, connected with a suction device. The electrostatic process is realized by charging the label with a certain charge before applying it into the mould, whereas the mould is maintained neutral or under the opposite charge. In both cases, once the label is positioned in the right area of the mould, it is maintained at its place during the injection step.

The label can be placed with the circuit towards the piece or towards the outside of the piece. If the circuit is placed towards the plastic piece, the back side of the label is visible on the plastic piece, which can show the graphic print if previously printed on this side as described before. When the label is placed in order to be at the surface of the plastic piece and no film has been laminated on it, the circuit is accessible for direct physical connection with any other electronic device in order to transmit any electric or electronic signal, such as data, information or power.

In another embodiment, the label can be introduced inside the plastic piece by two step injection or any appropriate means known by the skilled person. In the two step injection process, a first part of the plastic piece is moulded with the label at the surface and in a second step, the other part of the piece is moulded onto the first part and covers the label, which is eventually included inside the piece. In a more simple way, when the piece is less complex, it is possible to hold the label inside the mould with an appropriate fastener that maintains the label in position during the injection operation. In both cases, the label is fully embedded (or almost fully embedded) inside the plastic material of the piece and is totally protected. In cases where the polymer is opaque, this process leads to hide the label, for an additional protection benefit.

In particular embodiments, the label is fully (or almost fully) embedded within the moulded plastic piece. In particular embodiments thereof, the plastic piece is moulded in a single step, with the label maintained in a position away from the outer surface of the plastic piece; or the plastic piece is moulded in a two-step process, with the label embedded at the interface between the fraction of the pieced moulded in the first step and the fraction moulded in the second step.

The inclusion of the circuit inside the core of the plastic object may be of particular interest when a high protection of the electronic circuit is needed. This may be the case for OPV (Organic PhotoVoltaic or Organic Solar Cell) where functional polymers require a high oxygen protection currently achieved by complex encapsulation methods. Another application of the internal integration of the circuit can be OLED technology, for which moisture barrier is required to protect the polymers that are currently used.

The polymer used for making the plastic piece can be selected within the thermoplastic material family. Such thermoplastic material can be in particular polyester (in particular polyethylene terephthalate, PET, polybutylene terephthalate, PBT, polyethylene naphthalate, PEN, polylactic Acid, PLA, polyhydroxybutyrate and their copolymers), polyamide (in particular PA 6, PA 6.6, PA 6.10, PA 6.12, PA 11, PA12 and their copolymers), polyethylene (PE) in all its variations, based on density, molecular weight or branching (for example: low, medium or high density, linear or branched, high, ultra high, low, ultra low molecular weight and all their combinations), polypropylene, polycarbonate (PC), polystyrene (PS), polymethylmethacrylate (PMMA, including its modifications with comonomers such as methacrylic acid, acrylate, butyl acrylate), Acrylonitrile Butadiene Styrene (ABS), polyvinylchloride, polyether Sulfone, polyetherether Ketone, polyetherimide, polyphenyleneoxide and other less common grades.

It has been observed that during the moulding step, the contact between different materials, i.e the label and polymers, can show adhesion issues, bubbles entrapped between the label and the plastic piece or post moulding separation due to differential thermal expansion coefficients.

Surprisingly, the inventors have achieved very good affinity between the paper-based electronic circuits and many common polymers used in the plastic industry. Polypropylene (PP), polyester (in particular PET and PLA), polycarbonate (PC), polymethylmethacrylate (PMMA), acrylonitrilebutadienestyrene (ABS) all have given very good adhesion with paper, each of them in their normal injection conditions (265° C. to 290° C., depending on the polymer). With all these materials, once the plastic piece is moulded, the paper-based circuit is tightly stuck to the piece and no delamination is possible. This is particularly noteworthy regarding PET, which has low affinity with many other plastic material.

With polyamide 6.6 as the selected polymer for making plastic pieces, the paper-based electronic circuit may exhibit blisters after moulding. These defects come from both the humidity contained in the paper and the humidity contained in the polymer, as polyamide is known to be hygroscopic. By adjusting the mould temperature at 40° C. instead of a normal value of 70° C. and adjusting the steady pressure inside the mould after injection at a 20% to 50% drop, the label is fixed evenly to the plastic piece with a good adhesion and without blistering. In particular embodiments, preferably wherein the plastic object is made of polyamide (and more preferably of PA 6.6), the moulding conditions are adjusted relative to conditions for moulding such a plastic object without a paper based label by reducing mould temperature, in particular by 20° C. to 40° C. and/or by 20% to 50% and/or by reducing the pressure applied inside the mould after injection, in particular by 20% to 50%. In particularly preferred embodiments wherein the plastic object is made of PA 6.6, the mould temperature is set at or near 40° C. and the pressure inside the mould after injection is set at or near 250 bar.

As illustrated herein, in particular in the examples section below, carrying out the present method usually requires no specific adaptation of conventional moulding parameters. However, in cases where blistering and/or e.g. bubbles appear, the injection conditions (pressure profile, injection duration, polymer temperature, mould temperature) may be adjusted, as it plays a key role on the presence of blisters and has to be adapted according to the type of press, the shape of the piece and the injected polymer, as conventionally performed by the skilled person for each new making. With such adjustments, which are readily accessible to the skilled person, satisfactory adhesion and visual aspect was obtained with all the tested plastic materials, using paper-based electronic circuits which do not comprise any plastic film and without the need for any glue or adhesive.

An issue of polyester films solved by the method disclosed herein is the separation of the film from the plastic piece on cooling after moulding, especially when the polymer of the plastic piece is polyamide. When the plastic piece is cooling down after injection, a polyester label, initially adhering to the piece, progressively comes unstuck from the piece within 1 to 5 minutes. This behaviour is due to differential thermal expansion coefficients. Polyester (in particular PET) is known to show a lower thermal expansion coefficient than polyamide. Conversely to polyester films, paper can withstand significant dimensional variations once the paper label is stuck to the polymer after moulding, due to its plastic behaviour. Polyester (in particular PET) has a lower thermal expansion coefficient than most common other polymers used in the plastic industry, which strongly impairs the use of polyester-based circuits in these in-mould label integrations, compared to paper that offers a wide compatibility as explained above.

Provided herein is an in mould-label suitable for use in the methods disclosed above. Such an in-mould label comprises or consists of a paper substrate printed with electronic inks on at least one surface and at least one surface with sufficient affinity for the plastic material of the plastic object. In particular, such an in-mould label comprises no plastic film. In particular embodiments, the in-mould label comprises a printed electronic circuit but does not comprise a pre-manufactured electronic circuit or device, and in particular the paper substrate serves as a carrier for the electronic circuit, so that said circuit cannot be separated from the paper substrate by peeling, delaminating, etc. In alternative embodiments, the in-mould label comprises, in addition to pre-manufactured electronic circuits or devices, a printed electronic circuit, so that said circuit cannot be separated from the paper substrate by peeling, delaminating, etc., without at least partly destroying the circuit. In particular embodiments, the in-mould label has the features resulting from the above-mentioned embodiments of the method, in particular may present coating on or two of its surfaces, may carry an electronic circuit with the thickness properties disclosed above, etc. Generally, features of the products of the invention may, in particular embodiments, reflect features disclosed above in relation to the methods of the invention, whether related to the substrate, the circuit, etc.

The plastic objects carrying a label provided herein, obtained by the above-disclosed methods show unique properties. Such plastic objects comprise an embedded paper substrate printed with electronic inks and/or carrying a printed electronic circuit or device. In particular embodiments, such plastic objects do not comprise any plastic film on the outer surface of the label. In particular embodiments, the plastic objects do not comprise any plastic film on the inner surface of the label and in particular the paper substrate of the label is separated from the plastic material of the plastic object only by the electronic ink layer if such a layer is present on the inner surface of the label.

- Paper inlays are light, flexible, have a small z-footprint (Paper thickness can be as low as 30-80 µm) and easy to embed into a mould.
- Paper has a much better thermal resistance than most commonly used polymers, such as PEN or PET, for inlay substrate. So paper imparts better electronic performance and cheaper ink consumption to the circuits.
- Paper has a natural affinity with most thermoplastic polymers used in the plastic industry and therefore does not need any lamination film on its surface to adhere to the plastic pieces. This is the case with polyester (in particular PET or PBT), polyamide (PA), acrylonitrile butadiene styrene (ABS), polymethylmetacrylate (PMMA), polycarbonate (PC), polypropylene (PP), polylactic acid (PLA) and other standard polymers.
- In the particular case where there is no extra plastic overcoat on the outer surface (or on a fraction thereof), direct physical connections are possible.
- Depending on plastic raw material (from PE to Polycarbonate), the printed paper circuit can sustain a wide range of temperature during plastics flow (up to 400° C.)
- In some cases, visual graphical content has to be printed directly on plastic objects (to identify the plastic piece or to communicate information or branding). Paper with its brightness, whiteness and outstanding graphical printability, is ideal for such an operation and provides much better printability and runnability than plastics.
- Delamination is impossible, in particular since the circuit, at least in part, comprises components (in particular wiring) which are printed, and in particular are too intimately bound to the substrate and do not possess sufficient mechanical cohesion independently from the substrate to be removed therefrom and in particular to be removed without destruction of the circuit.

A summary of preferred embodiments is provided below, which is not intended to limit or comprehensively define the invention. Embodiments disclosed in the present application and not covered explicitly or implicitly in embodiments below are nevertheless provided as part of the invention. Definitions as provided above apply to the corresponding terms used below. As the skilled person will realize, most combinations of the features disclosed herein (and in particular in the embodiments below) are achievable and may present advantages, depending in particular on the application. Apart from combinations which will readily appear incompatible to the skilled person (in particular contradictory or irrelevant combinations), or which the present disclosure teaches to be incompatible, all single of multiple combinations of the below features are explicitly provided.

Provided herein is a method to manufacture a plastic object embedding a paper-based circuit, comprising the steps of:

A. providing or producing a paper-based electronic circuit, used as an in-mould label, and a mould, said mould being suitable for providing the shape of the plastic object;

B. positioning the paper-based electronic circuit inside the mould;

C. providing liquid plastic in the mould; and

D. allowing the plastic to solidify and recovering the moulded plastic object embedding the paper-based electronic circuit;

wherein the paper-based electronic circuit carries an electronic circuit which is at least partly printed on a paper-based substrate.

In particular embodiments, the plastic of which the plastic object is made is a thermoplastic selected in the group consisting of: polyester (in particular polyethylene terephthalate, polybutylene terephthalate, polyethylene naphthalate, polylactic Acid, polyhydroxybutyrate and their copolymers), polyamide (in particular PA 6, PA 6.6, PA 6.10, PA 6.12, PA 11, PA12 and their copolymers), polyethylene (in particular low, medium or high density, linear or branched, high, ultra-high, low, ultra-low molecular weight polyethylenes and all their combinations), polypropylene, polycarbonate, polystyrene, polymethylmethacrylate (optionally modified with comonomers such as methacrylic acid, acrylate, butyl acrylate), acrylonitrile butadiene styrene, polyvinylchloride, polyether sulfone, polyetherether ketone, polyetherimide, polyphenyleneoxide. In particular embodiments, said thermoplastic is selected among the group consisting of: polyethylene terephthalate (PET), polypropylene (PP), polyamide (PA), polymethylmethacrylate (PMMA), acrylonitrile butadiene styrene (ABS), polycarbonate (PC) and polylactic acid (PLA).

In particular embodiments of any of the above embodiments, the method comprises prior to step B a step of applying a plastic overcoat of the in-mould label on the outer surface, on the inner surface (or on both the inner surfaces), or on both the outer and the inner surfaces of the in-mould label. In particular, an adhesion-improving overcoat is applied on at least one inner surface and/or a protective overcoat is applied on at least one surface. In particular embodiments, the step of applying a plastic overcoat comprises laminating a plastic film. In particular embodiments, the step of applying a plastic overcoat comprises coating a plastic layer. In particular embodiments, the plastic of the overcoat is selected in the group consisting of PET, PMMA, PC, PA, PP and PLA, and, in particular in the case of an adhesion-improving overcoat, is preferably of the same plastic as the injected plastic. In particular embodiments, the plastic of the overcoat (in particular of the protective overcoat, in particular when applied on a side of the paper-based electronic circuit which is graphically printed) is transparent. In particular embodiments, the overcoat is applied at least on the side of paper-based electronic circuit carrying the circuit.

In particular embodiments of any of the above embodiments, the paper-based substrate is a coated paper substrate, wherein such coating is suitable for printing with electronic inks and in particular wherein such coating comprises pigments and a binder.

In particular embodiments, the paper-based electronic circuit does not comprise any plastic film. In particular embodiments, the paper-based electronic circuit does not comprise any plastic material.

In particular embodiments of any of the above embodiments, the paper substrate comprises at 70 to 90% of short cellulosic fibres by dry weight. In particular embodiments, the coating comprises a binder with a glass transition temperature lower than 20° C., preferably wherein the coating comprises 5 to 50 parts by dry weight of such binder. In particular embodiments, the paper substrate has an ISO brightness and/or a D65 brightness in the range 70 to 90, preferably 75 to 85 and/or the difference in ISO brightness and/or D65 brightness before and after exposing the paper substrate to heat during 5 min at 180° C. is equal to or less than 3.

In particular embodiments of any of the above embodiments, the paper substrate has a Bekk smoothness equal to or higher than 900 s, preferably equal to or higher than 2000 s. In particular embodiments, the paper substrate has a gloss at 75° equal to or higher than 70%, preferably equal to or higher than 80%.

In particular embodiments of any of the above embodiments, the paper substrate is selected among Powercoat HD and Powercoat XD papers.

In particular embodiments of any of the above embodiments, step A comprises providing a paper-based substrate and printing an electronic circuit on said paper-based substrate. In particular embodiments of any of the above embodiments, step A comprises providing a paper-based electronic circuit which comprises a printed electronic circuit. In particular embodiments, the printed electronic circuit is printed by inkjet printing, offset printing, flexography, gravure printing, screen printing and/or xerography.

In particular embodiments of any of the above embodiments, the printed electronic circuit comprises at least electrically conductive inks. In particular embodiments, the printed electronic circuit comprises inks with suitable conductance, resistance, and/or impedance properties and/or dielectric, semiconducting, photovoltaic and/or electroluminescent properties. In particular embodiments, the printed electronic circuit comprises organic inks. In particular embodiments, the organic inks comprise conductive polymers and/or polymer semiconductors, in particular conjugated polymers. In particular embodiments, the printed electronic circuit comprises inorganic inks. In particular embodiments, the inorganic inks comprise dispersions of metallic or semiconducting particles, in particular micro and nanoparticles, in particular silver and/or gold particles and/or particles comprising silicon or oxide semiconductors.

In particular embodiments of any of the above embodiments, step A additionally comprises the step of sintering the ink by heating the paper-based electronic circuit. In particular embodiments of any of the above embodiments, step A comprises providing a paper-based electronic circuit wherein the electronic ink were sintered by heating the paper-based electronic circuit. In particular embodiments, the sintering is performed at a temperature higher than 120° C., and preferably higher than 150° C.

In particular embodiments of any of the above embodiments, the paper-based electronic circuit is additionally graphically printed (i.e. printed in order to modify its visual appearance). In particular embodiments, step A comprises providing a graphically printed paper-based substrate or paper-based electronic circuit. In particular embodiments, step A comprises a graphical printing step. In particular embodiments, said graphical printing step is performed using inkjet printing, offset printing, flexography, gravure printing, screen printing and/or electrophotography.

In particular embodiments of any of the above embodiments, the printed paper-based electronic circuit comprises a printed antenna.

In particular embodiments of any of the above embodiments, the provided paper-based electronic circuit carries non-printed electronic components in addition to the printed electronic circuit. In particular embodiments of any of the above embodiments, step A comprises appending non-printed electronic components to the paper-based electronic circuit. In particular embodiments, the non-printed electronic components are appended, in particular soldiered, to the paper-based electronic circuit using pick and place. In particular embodiments, such non-printed components are a chip, in particular a chip forming part of an RFID transponder, and/or an LED. In particular embodiments, the printed electronic circuit comprises essentially all the wiring of the circuit. In particular embodiments, the circuit comprises a non-printed chip and a printed electronic circuit comprising an antenna and suitable wiring, and forms an RFID transponder.

In particular embodiments of any of the above embodiments, step C comprises injecting a heated thermoplastic and step D comprises allowing said thermoplastic to cool to a temperature where it is solid.

In particular embodiments of any of the above embodiments, the printed electronic circuit is on the (or one of the) inner surface(s) of the in-mould label. In alternative embodiments, the printed electronic circuit is on the outer surface of the in-mould label. In alternative embodiments, a printed electronic circuit is printed on both sides of the in-mould label. In particular embodiments wherein the printed electronic circuit is at least in part printed on the outer surface, the printed electronic circuit is at least partly physically accessible at the surface of the plastic object.

In particular embodiments of any of the above embodiments, the paper-based electronic circuit is embedded at the surface of the plastic object. In alternative embodiments, the paper-based electronic circuit is fully embedded inside, or almost fully embedded inside, the plastic object.

In particular embodiments of any of the above embodiments, the mould comprises wedges, ridges, or alternative positioning structures to prevent lateral movement of the label during step C. In particular embodiments of any of the above embodiments, the paper-based electronic circuit is held in place during step C by electrostatic force or by applying vacuum.

In particular embodiments wherein the paper-based electronic circuit is embedded inside the plastic object, the label is held during moulding in a position away from the surface of the resulting piece, resulting in complete (or almost complete) embedding of the paper-based electronic circuit. In particular embodiments wherein the paper-based electronic circuit is embedded inside the plastic object, a second moulding step is performed after step D, wherein the plastic added in the second moulding step covers the label, resulting in complete (or almost complete) embedding of the paper-based electronic circuit.

Provided herein is a plastic object comprising an embedded paper-based electronic circuit, said paper-based electronic circuit comprising a paper-based substrate with a printed electronic circuit.

In particular embodiments, the plastic of which the object is made is a thermoplastic selected in the group consisting of: polyester (in particular polyethylene terephthalate, polybutylene terephthalate, polyethylene naphthalate, polylactic acid, polyhydroxybutyrate and their copolymers), polyamide (in particular PA 6, PA 6.6, PA 6.10, PA 6.12, PA 11, PA12 and their copolymers), polyethylene (in particular low, medium or high density, linear or branched, high, ultra-high, low, ultra-low molecular weight polyethylenes and all their combinations), polypropylene, polycarbonate, polystyrene, polymethylmethacrylate (optionally modified with comonomers such as methacrylic acid, acrylate, butyl acrylate), acrylonitrile butadiene styrene, polyvinylchloride, polyether sulfone, polyetherether ketone, polyetherimide, polyphenyleneoxide and biodegradable thermoplastics such as polylactic acid (PLA). In particular embodiments, the plastic is selected among the group consisting of: PET, PP, PA, PMMA, ABS, PC and PLA.

In particular embodiments of any of the above embodiments, the paper-based substrate is a coated paper substrate, wherein such coating is suitable for printing with electronic inks and in particular wherein such coating comprises pigments and a binder.

In particular embodiments of any of the above embodiments, the paper substrate comprises at 70 to 90% of short cellulosic fibers by dry weight. In particular embodiments, the coating comprises a binder with a glass transition temperature lower than 20° C., preferably wherein the coating comprises 5 to 50 parts by dry weight of such binder. In particular embodiments, the paper substrate has an ISO brightness and/or a D65 brightness in the range 70 to 90, preferably 75 to 85 and/or the difference in ISO brightness and/or D65 brightness before and after exposing the paper substrate to heat during 5 min at 180° C. is equal to or less than 3.

In particular embodiments of any of the above embodiments, the paper substrate has a Bekk smoothness equal to or higher than 900 s, preferably equal to or higher than 2000 s. In particular embodiments, the paper substrate has a gloss at 75° equal to or higher than 70%, preferably equal to or higher than 80%.

In particular embodiments of any of the above embodiments, the paper substrate is selected among Powercoat HD and Powercoat XD papers.

In particular embodiments of any of the above embodiments, no glue or adhesive is present between the paper-based electronic circuit and the plastic of the plastic object. In particular embodiments, no glue or adhesive is present between the paper substrate of the paper-based electronic circuit and the plastic or between the overcoat of the paper-based electronic circuit and the plastic. In particular embodiments, no glue or adhesive is present between the layer of the paper-based electronic circuit comprising the circuit and the plastic of the plastic object.

In particular embodiments of any of the above embodiments, a plastic overcoat is present on at least one side of the paper-based electronic circuit (in particular the printed electronic circuit and/or printed graphics are comprised in a layer between the paper substrate and the overcoat). In particular embodiments, the outer surface of the paper-based electronic circuit comprises a protective overcoat. In particular embodiments, an inner surface of the paper-based electronic circuit comprises an adhesion-improving overcoat. In particular embodiments, the plastic of the overcoat is selected from the group consisting of PET, PMMA, PC, PA and PP. In particular embodiments, the overcoat consists of or comprises a laminated plastic film. In particular embodiments, one side of the paper-based electronic circuit comprises an overcoat comprising a plastic film, or the two sides of the paper-based electronic circuit each comprise an overcoat comprising a plastic film. In alternative embodiments, the paper-based electronic circuit is devoid of any plastic film.

In particular embodiments of any of the above embodiments, the printed electronic circuit comprises at least electrically conductive inks. In particular embodiments, the printed electronic circuit comprises inks with suitable conductance, resistance, and/or impedance properties and/or dielectric, semiconducting, photovoltaic and/or electroluminescent properties. In particular embodiments, the printed electronic circuit comprises organic inks. In particular embodiments, the organic inks comprise conductive polymers and/or polymer semiconductors, in particular conjugated polymers. In particular embodiments, the printed electronic circuit comprises inorganic inks. In particular embodiments, the inorganic inks comprise dispersions of metallic or semiconducting particles, in particular micro and nanoparticles, in particular silver and/or gold particles and/or particles comprising silicon or oxide semiconductors.

In particular embodiments of any of the above embodiments, the electronic inks of the paper-based electronic circuit were sintered by heating the paper-based electronic circuit. In particular embodiments, the sintering was performed at a temperature higher than 120° C., and preferably higher than 150° C.

In particular embodiments of any of the above embodiments, the paper-based electronic circuit is additionally graphically printed (i.e. printed in order to modify its visual appearance).

In particular embodiments of any of the above embodiments, the printed paper-based electronic circuit comprises a printed antenna.

In particular embodiments of any of the above embodiments, the paper-based electronic circuit carries non-printed electronic components in addition to the printed electronic circuit. In particular embodiments, the non-printed electronic components are soldiered to the printed electronic circuit. In particular embodiments, such non-printed components are a chip, in particular a chip forming part of an RFID transponder, and/or an LED. In particular embodiments, the printed electronic circuit comprises essentially all the wiring of the circuit. In particular embodiments, the circuit comprises a non-printed chip and a printed electronic circuit comprising an antenna and suitable wiring, and forms an RFID transponder.

In particular embodiments of any of the above embodiments, the printed electronic circuit is on the (or one of the) inner surface(s) of the in-mould label. In alternative embodiments, the printed electronic circuit is on the outer surface of the in-mould label. In alternative embodiments, a printed electronic circuit is printed on both sides of the in-mould label. In particular embodiments wherein the printed electronic circuit is at least in part printed on the outer surface, the printed electronic circuit is at least partly physically accessible at the surface of the plastic object.

In particular embodiments of any of the above embodiments, the paper-based electronic circuit is embedded at the surface of the plastic object. In alternative embodiments, the paper-based electronic circuit is fully embedded inside, or almost fully embedded inside, the plastic object.

In particular embodiments of any of the above embodiments wherein the paper-based electronic circuit is embedded at the surface of the plastic object, the paper-based electronic circuit is flush with the surface of the plastic object and in particular the paper-based electronic circuit does not protrude from the plastic object. In particular embodiments, the plastic object has grooves surrounding the embedded circuitry, resulting from ridged in the mould which served to prevent lateral movement of the circuitry during injection moulding.

EXAMPLES

Example 1

A paper is produced according to patent WO2015059157. This paper is printed with an antenna by screen printing. Then a chip is put by pick and place to create an activable circuit with this antenna and the chip is encoded to be readable by any NFC device.

A mould is created for special integration of labels with small ridges that limit the area for the label, in order to maintain it during the moulding operation. Polyester (PET) is placed into the injection system of a press that will operate the mould. Heating temperature of the polymer is 260° C. The mould is maintained at room temperature.

The paper label is placed into the mould with the circuit towards the piece (i.e. on the inner surface of the label). The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device is able to read the encoded message from the chip.

Example 2

With materials and a process identical to Example 1, the paper label is placed into the mould with the circuit outside the piece (on the outer surface). The visual aspect of the label is flat and well stuck to the piece. By trying to measure the adhesion of the label to the piece, it appears impossible to release the label from the piece as the label is systematically destroyed. The NFC device is able to read the encoded message from the chip. In this configuration, as the circuit remains on the outside of the plastic piece, a direct contact or connection with any device is possible.

Example 3

A paper is produced according to patent WO2015059157. This paper is printed with an antenna by screen printing. Then a chip is put by pick and place to create an activable circuit with this antenna and the chip is encoded to be readable by any NFC device.

A polyester film is laminated on the side of the printed paper with the circuit. The paper and the polyester film are placed on a laminator. Glue is prepared with polyurethane resin and a crosslinker. The glue is applied preferably on the film then the contact with the paper is operated, the complex is pulled through the nip of a 2 roll system. Then the complex is dried.

A mould is created for special integration of circuitries with small wedges that limit the area for the label, in order to maintain it during the moulding operation. Polyester (PET) is placed into the injection system of a press that will operate the mould. Heating temperature of the polymer is 260° C. The mould is maintained at room temperature.

The laminated paper label is placed into the mould with the circuit on the outer surface. The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device is able to read the encoded message from the chip. The polyester film laminated on the paper label provides an additional surface protection to the circuit, although the label remains perfectly visible if the polyester film is transparent.

Example 4

With materials and a process identical to Example 3, wherein the paper is laminated on the face opposite to the face with the printed electronic circuit, a laminated paper label is placed into the mould with the circuit towards the piece (on the inner surface). The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device is able to read the encoded message from the chip. The polyester film laminated on the paper label provides an additional surface protection to the paper.

Example 5

A paper is produced according to patent WO2015059157. This paper is printed with an antenna by screen printing. Then a LED is put by pick and place to create an activable circuit with this antenna.

A mould is created for special integration of labels with small wedges that limit the area for the label, in order to maintain it during the moulding operation. Polyester (PET) is placed into the injection system of a press that will operate the mould. Heating temperature of the polymer is 260° C. The mould is maintained at room temperature.

A paper label is placed into the mould with the circuit towards the piece (on the inner surface). The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device applied against the area of the LED is able to en light the LED.

Example 6

With materials and a process identical to Example 5, the paper label is placed into the mould with the circuit outside the piece (on the outer surface). The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device applied against the area of the LED is able to enlight the LED. In this configuration, as the circuit remains on the outside of the plastic piece, a direct contact or connection with any device is possible.

Example 7

A paper is produced according to patent WO2015059157. This paper is printed with an antenna by screen printing. Then a LED is put by pick and place to create an activable circuit with this antenna.

A polyester film is laminated on the side of the printed paper with the circuit. The paper and the polyester film are placed on a laminator. Glue is prepared with polyurethane resin and a crosslinker. The glue is applied preferably on the film then the contact with the paper is operated, the complex is pulled through the nip of a 2 roll system. Then the complex is dried.

A mould is created for special integration of labels with small wedges that limit the area for the label, in order to maintain it during the moulding operation. Polyester (PET) is placed into the injection system of a press that will operate the mould. Heating temperature of the polymer is 260° C. The mould is maintained at room temperature.

The laminated paper label is placed into the mould with the circuit outside the piece. The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device applied against the area of the LED is able to enlight the LED. The polyester film laminated on the paper label provides an additional surface protection to the paper.

Example 8

With materials and a process identical to Example 7, wherein the paper is laminated on the face opposite to the face with the printed electronic circuit, a laminated paper label is placed into the mould with the circuit towards the piece (on the inner surface). The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device applied against the area of the LED is able to enlight the LED. The polyester film laminated on the paper label provides an additional surface protection to the paper. The polyester film laminated on the paper label provides an additional surface protection to the paper.

Example 9

A paper-based electronic circuit is produced and embedded similarly to example 1, starting with a paper produced according to French patent FR2954361. The visual aspect of the label is flat and well stuck to the piece. By trying to measure the adhesion of the label to the piece, it appears impossible to release the label from the piece as the label is systematically destroyed. The NFC device is able to read the encoded message from the chip.

Example 10

A paper-based electronic circuit is produced and embedded similarly to example 2, starting with a paper produced according to French patent FR2954361. The visual aspect of the label is flat and well stuck to the piece. By trying to measure the adhesion of the label to the piece, it appears impossible to release the label from the piece as the label is systematically destroyed. The NFC device is able to read the encoded message from the chip. In this configuration, as the circuit remains on the outside of the plastic piece, a direct contact or connection with any device is possible.

Example 11

A paper-based electronic circuit is produced and embedded similarly to example 3, starting with a paper produced according to French patent FR2954361. The laminated paper label is placed into the mould with the circuit outside the piece. The visual aspect of the label is flat and well stuck to the piece. By trying to measure the adhesion of the label to the piece, it appears impossible to release the label from the piece as the label is systematically destroyed. The NFC device is able to read the encoded message from the chip. The polyester film laminated on the paper label provides an additional surface protection to the circuit, although remaining perfectly visible if the polyester film is transparent.

Example 12

A paper label carrying a circuit is produced and embedded similarly to example 4, starting with a paper produced according to French patent FR2954361. The polyester film is laminated on the side opposite to the printed paper with the circuit and the laminated paper label is placed into the mould with the circuit towards the piece. The visual aspect of the label is flat and well stuck to the piece. By trying to measure the adhesion of the label to the piece, it appears impossible to release the label from the piece as the label is systematically destroyed. The NFC device is able to read the encoded message from the chip. The polyester film laminated on the paper label provides an additional surface protection to the paper.

Example 13

A paper label carrying an LED is produced and embedded similarly to example 5, starting with a paper produced according to French patent FR2954361. The paper label is placed into the mould with the circuit towards the piece. The visual aspect of the label is flat and well stuck to the piece. By trying to measure the adhesion of the label to the piece, it appears impossible to release the label from the piece as the label is systematically destroyed. The NFC device applied against the area of the LED is able to enlight the LED.

Example 14

A paper label carrying an LED is produced and embedded similarly to example 6, starting with a paper produced according to French patent FR2954361. The paper label is placed into the mould with the circuit outside the piece. The visual aspect of the label is flat and well stuck to the piece. By trying to measure the adhesion of the label to the piece, it appears impossible to release the label from the piece as the label is systematically destroyed. The NFC device applied against the area of the LED is able to enlight the LED. In this configuration, as the circuit remains on the outside of the plastic piece, a direct contact or connection with any device is possible.

Example 15

A laminated paper label carrying an LED is produced and embedded similarly to example 7, starting with a paper produced according to French patent FR2954361. The polyester film is laminated on the side of the printed paper with the circuit and the laminated paper label is placed into the mould with the circuit outside the piece. The visual aspect of the label is flat and well stuck to the piece. By trying to measure the adhesion of the label to the piece, it appears impossible to release the label from the piece as the label is systematically destroyed. The NFC device applied against the area of the LED is able to enlight the LED. The polyester film laminated on the paper label provides an additional surface protection to the circuit, although remaining perfectly visible if the polyester film is transparent.

Example 16

A laminated paper label carrying an LED is produced and embedded similarly to example 8, starting with a paper produced according to French patent FR2954361. The polyester film is laminated on the side opposite to the printed paper with the circuit and the paper label is placed into the mould with the circuit towards the piece. The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device applied against the area of the LED is able to enlight the LED. The polyester film laminated on the paper label provides an additional surface protection to the paper.

Example 17

A paper is produced according to patent WO2015059157. This paper is printed with an antenna by screen printing. Then a chip is put by pick and place to create an activable circuit with this antenna and the chip is encoded to be readable by any NFC device.

A mould is created for special integration of labels with small wedges that limit the area for the label, in order to maintain it during the moulding operation. Polymethylmethacrylate (PMMA) is placed into the injection system of a press that will operate the mould. Heating temperature of the polymer is 270° C. The mould is maintained at 70° C.

The paper label is placed into the mould with the circuit towards the piece. The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device is able to read the encoded message from the chip.

Example 18

A paper is produced according to patent WO2015059157. This paper is printed with an antenna by screen printing. Then a chip is put by pick and place to create an activable circuit with this antenna and the chip is encoded to be readable by any NFC device.

A polymethylmethacrylate film is laminated on the side of the printed paper with the circuit. The paper and the polymethylmethacrylate film are placed on a laminator. Glue is prepared with polyurethane resin and a crosslinker. The glue is applied preferably on the film then the contact with the paper is operated, the complex is pulled through the nip of a 2 roll system. Then the complex is dried.

A mould is created for special integration of labels with small wedges that limit the area for the label, in order to maintain it during the moulding operation. Polymethylmethacrylate (PMMA) is placed into the injection system of a press that will operate the mould. Heating temperature of the polymer is 270° C. The mould is maintained at 70° C.

The paper label is placed into the mould with the circuit outside the piece. The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device is able to read the encoded message from the chip. The film laminated on the paper label provides an additional surface protection to the circuit, the label remains perfectly visible if the film is transparent.

Example 19

In an experiment similar to Example 17, a paper label carrying a circuit is placed in a mould wherein polycarbonate (PC) is injected. Heating temperature of the polymer is 290° C. The mould is maintained at 90° C. The paper label is placed into the mould with the circuit towards the piece (on the inner surface). The visual aspect of the label is flat and well stuck to the piece. By trying to measure the adhesion of the label to the piece, it appears impossible to release the label from the piece as the label is systematically destroyed. The NFC device is able to read the encoded message from the chip.

Example 20

In an experiment similar to Example 18, a PC-laminated paper label carrying a circuit is placed in a mould wherein polycarbonate (PC) is injected. The polycarbonate film is laminated on the side of the printed paper with the circuit. Heating temperature of the polymer is 290° C. The mould is maintained at 90° C. The paper label is placed into the mould with the circuit outside the piece (on the outer surface). The visual aspect of the label is flat and well stuck to the piece. By trying to measure the adhesion of the label to the piece, it appears impossible to release the label from the piece as the label is systematically destroyed. The NFC device is able to read the encoded message from the chip. The film laminated on the paper label provides an additional surface protection to the circuit, although the label remains perfectly visible if the film is transparent.

Example 21

In an experiment similar to Example 17, a paper label carrying a circuit is placed in a mould wherein polypropylene (PP) is injected. Heating temperature of the polymer is 240° C. The mould is maintained at 30° C. The visual aspect of the label is flat and well stuck to the piece. By trying to measure the adhesion of the label to the piece, it appears impossible to release the label from the piece as the label is systematically destroyed. The NFC device is able to read the encoded message from the chip.

Example 22

In an experiment similar to Example 18, a polypropylene-laminated paper label carrying a circuit is placed in a mould wherein polypropylene (PP) is injected. The polypropylene film is laminated on the side of the printed paper with the circuit. Heating temperature of the polymer is 240° C. The mould is maintained at 30° C. The laminated paper label is placed into the mould with the circuit outside the piece (on the outer surface). The visual aspect of the label is flat and well stuck to the piece. By trying to measure the adhesion of the label to the piece, it appears impossible to release the label from the piece as the label is systematically destroyed. The NFC device is able to read the encoded message from the chip. The film laminated on the paper label provides an additional surface protection to the circuit, although the label remains perfectly visible if the film is transparent.

Example 23

In an experiment similar to Example 17, a paper label carrying a circuit is placed in a mould wherein acrylonitrilebutadienestyrene (ABS) is injected. Heating temperature of the polymer is 260° C. The mould is maintained at 60° C.

The paper label is placed into the mould with the circuit towards the piece. The visual aspect of the label is flat and well stuck to the piece. By trying to measure the adhesion of the label to the piece, it appears impossible to release the label from the piece as the label is systematically destroyed. The NFC device is able to read the encoded message from the chip.

Example 24

In an experiment similar to Example 18, a polymethylmethacrylate-laminated paper label carrying a circuit is placed in a mould wherein acrylonitrilebutadienestyrene (ABS) is injected. The polymethylmethacrylate film is laminated on the side of the printed paper with the circuit. Heating temperature of the polymer is 260° C. The mould is maintained at 60° C. The paper label is placed into the mould with the circuit outside the piece. The visual aspect of the label is flat and well stuck to the piece. By trying to measure the adhesion of the label to the piece, it appears impossible to release the label from the piece as the label is systematically destroyed. The NFC device is able to read the encoded message from the chip. The film laminated on the paper label provides an additional surface protection to the circuit, although the label remains perfectly visible if the film is transparent.

Example 25

In an experiment similar to Example 17, a paper label carrying a circuit is placed in a mould wherein polyamide 6.6 (PA6.6) is injected. Heating temperature of the polymer is 280° C. The mould is maintained at 70° C. The steady pressure of the press is set at 500 bar. The paper label is placed into the mould with the circuit towards the piece. The visual aspect shows some blisters. 50% of the encoded chips are no more readable by the NFC device.

Example 26

In an experiment similar to Example 17, a paper label carrying a circuit is placed in a mould wherein polyamide 6.6 (PA6.6) is injected, with the heating temperature of the polymer set at 280° C., the mould maintained at 40° C. and the steady pressure of the press set at 250 bar. The paper label is placed into the mould with the circuit towards the piece. The visual aspect of the label is flat and well stuck to the piece. By trying to measure the adhesion of the label to the piece, it appears impossible to release the label from the piece as the label is systematically destroyed. The NFC device is able to read the encoded message from the chip.

Example 27

In an experiment similar to Example 18, a polyamide-laminated paper label carrying a circuit is placed in a mould wherein polyamide 6.6 (PA6.6) is injected. The polyamide film is laminated on the side of the printed paper with the circuit. Heating temperature of the polymer is 280° C. The mould is maintained at 40° C. The steady pressure of the press is set at 250 bar. The paper label is placed into the mould with the circuit outside the piece. The visual aspect of the label is flat and well stuck to the piece. By trying to measure the adhesion of the label to the piece, it appears impossible to release the label from the piece as the label is systematically destroyed. The NFC device is able to read the encoded message from the chip. The film laminated on the paper label provides an additional surface protection to the circuit, although the label remains perfectly visible if the film is transparent.

Comparative Example 28

A polyester film is printed with an antenna by screen printing. Then a LED is put by pick and place to create an activable circuit with this antenna.

A mould is created for special integration of labels with small wedges that limit the area for the label, in order to maintain it during the moulding operation. Polyamide 6.6 (PA6.6) is placed into the injection system of a press that will operate the mould. Heating temperature of the polymer is 280° C. The mould is maintained at 70° C.

A polyester label is placed into the mould with the circuit towards the piece (on the inner surface). The press operates the polymer injection. On opening the press, the plastic piece is collected and tested. The visual aspect of the label is flat but quickly comes unstuck from the plastic piece without any mechanical action.

Comparative Example 29

In an experiment similar to Comparative Example 28, a polyester film carrying a LED is placed into mould with the circuit outside the piece (on the outer surface) and PA6.6. is injected. The visual aspect of the label is flat but quickly comes unstuck from the plastic piece without any mechanical action.

Example 30

A paper is produced according to patent WO2015059157. This paper is printed with a full color advertisement on the back side. Then the paper is printed with an antenna by screen printing on the front side. A chip is put by pick and place to create an activable circuit with this antenna and the chip is encoded to be readable by any NFC device.

A mould is created for special integration of labels with small wedges that limit the area for the label, in order to maintain it during the moulding operation. Polyester (PET) is placed into the injection system of a press that will operate the mould. Heating temperature of the polymer is 260° C. The mould is maintained at room temperature.

The paper label is placed into the mould with the circuit towards the piece. The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device is able to read the encoded message from the chip. The advertisement message is fully visible on the label.

Example 31

A paper is produced according to patent WO2015059157. This paper is printed with an antenna by screen printing. Then a LED is put by pick and place to create an activable circuit with this antenna.

A mould is created for special integration of labels with small wedges that limit the area for the label, in order to maintain it during the moulding operation. PolyMethyl-MetAcrylate (PMMA) is placed into the injection system of a press that will operate the mould. Heating temperature of the polymer is 270° C. The mould is maintained at 70° C.

A paper label is placed into the mould with the circuit towards the piece (on the inner surface). The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device applied against the area of the LED is able to en light the LED.

Example 32

In an experiment similar to Example 18, a PE-laminated paper label carrying a circuit is placed in a mould wherein polyethylene (PE) is injected. The polyethylene film is laminated on the side of the printed paper with the circuit. Heating temperature of the polymer is 210° C. The mould is maintained at room temperature. The paper label is placed into the mould with the circuit inside the piece (on the inner surface). The visual aspect of the label is flat and well stuck to the piece. By trying to measure the adhesion of the label to the piece, it appears impossible to release the label from the piece as the label is systematically destroyed. The NFC device is able to read the encoded message from the chip. The film laminated on the paper label provides an additional surface protection to the circuit, although the label remains perfectly visible if the film is transparent.

Example 33

A paper is produced according to patent WO2015059157. This paper is printed with an antenna by screen printing. Then a LED is put by pick and place to create an activable circuit with this antenna.

A mould is created for special integration of labels with small wedges that limit the area for the label, in order to maintain it during the moulding operation. PolyLactic Acid (PLA) is placed into the injection system of a press that will operate the mould. Heating temperature of the polymer is 210° C. The mould is maintained at 40° C.

A paper label is placed into the mould with the circuit towards the piece (on the inner surface). The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device applied against the area of the LED is able to en light the LED.

Example 34

A paper is produced according to patent WO2015059157. This paper is printed with an antenna by screen printing. Then a LED is put by pick and place to create an activable circuit with this antenna.

A mould is created for special integration of labels with small wedges that limit the area for the label, in order to maintain it during the moulding operation. PolyLacticAcid (PLA) is placed into the injection system of a press that will operate the mould. Heating temperature of the polymer is 210° C. The mould is maintained at room temperature.

A paper label is placed into the mould with the circuit outside the piece (on the outer surface). The press operates the polymer injection. On opening the press, the plastic piece is collected and tested. The visual aspect of the label is flat and well stuck to the piece. By trying to measure the adhesion of the label to the piece, it appears impossible to release the label from the piece as the label is systematically destroyed. The NFC device applied against the area of the LED is able to enlight the LED

The invention claimed is:

1. A method to manufacture a plastic object embedding a paper-based circuit, comprising steps of:

A. providing or producing a paper-based electronic circuit, for use as an in-mould label, and a mould, the mould being suitable for providing the shape of the plastic object;
B. positioning the paper-based electronic circuit inside the mould;
C. providing liquid plastic in the mould; and
D. allowing the plastic to solidify and recovering the moulded plastic object embedding the paper-based electronic circuit;
wherein the paper-based electronic circuit carries an electronic circuit which is at least partly printed on a paper-based substrate.

2. The method according to claim 1 wherein step A comprises:
producing a paper-based electronic circuit comprising a printed electronic circuit and/or printing an electronic circuit on a paper-based substrate;
wherein the paper-based electronic circuit is optionally produced on a graphically printed paper-based substrate and/or is graphically printed.

3. The method according to claim 1, wherein the plastic of which the object is made is a thermoplastic and wherein step C comprises injecting the heated thermoplastic and step D comprises allowing the thermoplastic to cool.

4. The method according to claim 3, wherein the thermoplastic is selected from the group consisting of: polyester, polyamide, polyethylene, polypropylene, polycarbonate, polystyrene, polymethylmethacrylate optionally modified with comonomers, acrylonitrile butadiene styrene, polyvinylchloride, polyether sulfone, polyetherether ketone, polyetherimide and polyphenyleneoxide.

5. The method according to claim 1, wherein the paper-based substrate is a coated paper, wherein the coating comprises a binder and pigments and is suitable for printing with electronic inks, wherein:
ii) the coating comprises a binder with a glass transition temperature lower than 20° C., wherein the coating comprises 5 to 50 parts by dry weight of the binder; and/or
iii) the paper-based substrate has an ISO brightness and/or D65 brightness in the range 70 to 90.

6. The method according to claim 5, wherein the paper-based substrate has a Bekk smoothness equal to or higher than 900 s and/or has a gloss at 75° equal to or higher than 70%.

7. The method according to claim 5, wherein the paper-based substrate is selected among Powercoat® HD and Powercoat® XD papers.

8. The method according to claim 1, wherein the paper-based substrate and/or the paper-based electronic circuit is devoid of any plastic film.

9. The method according to claim 1, wherein the printed electronic circuit comprises an ink or inks selected among
iv) organic inks; and
v) inorganic inks.

10. The method according to claim 1, wherein step A comprises a step of sintering the electronic inks by heating the paper-based electronic circuit.

11. The method according to claim 1, wherein the printed electronic circuit comprises an antenna.

12. The method according to claim 1, wherein step A comprises obtaining a paper-based electronic circuit carrying non-printed electronic components in addition to the printed electronic circuit and/or wherein step A comprises appending non-printed electronic components to the paper-based electronic circuit.

13. The method according to claim 12, wherein the non-printed electronic components comprise a chip.

14. The method according to claim 1, wherein
(i) the paper-based electronic circuit is embedded at the surface of the plastic object and wherein the circuit is printed on the outer surface, on the inner surface or on both the inner surface and the outer surface of the paper-based label; or
(ii) the paper-based electronic circuit is fully or almost fully embedded inside the plastic object.

15. The method according to claim 1, wherein step A further comprises a step of applying a plastic overcoat to at least one surface of the paper-based electronic circuit.

16. The method according to claim 15, wherein said the overcoat comprises a laminated plastic film and/or a coated plastic layer, wherein the plastic is selected among the group consisting of PET, PMMA, PC, PA, PP and PLA.

17. A plastic object obtained by the method of claim 1, comprising an embedded paper-based electronic circuit comprising a paper-based substrate carrying a printed electronic circuit.

18. The plastic object according to claim 17, made of a thermoplastic selected from the group consisting of: polyester, polyamide, polyethylene, polypropylene, polycarbonate, polystyrene, polymethylmethacrylate optionally modified with comonomers, acrylonitrile butadiene styrene, polyvinylchloride, polyether sulfone, polyetherether ketone, polyetherimide and polyphenyleneoxide.

19. The plastic object according to claim 17, wherein the paper-based substrate is a coated paper, wherein the coating comprises a binder and pigments and is suitable for printing with electronic inks, wherein:
ii) the coating comprises a binder with a glass transition temperature lower than 20° C., wherein the coating comprises 5 to 50 parts by dry weight of such binder; and/or
iii) the paper-based substrate has an ISO brightness and/or D65 brightness in the range 70 to 90.

20. The plastic object according to claim 17, wherein:
(i) the paper-based electronic circuit is embedded at the surface of the plastic object, and wherein the printed electronic circuit is on the outer surface, the inner surface, or both the outer surface and the inner surface of the paper-based electronic circuit; or
(ii) the paper-based electronic circuit is fully or almost fully embedded inside the plastic object.

21. The plastic object according to claim 17, wherein the outer surface of the paper-based electronic circuit is at least partly covered by a protective plastic overcoat.

* * * * *